(12) United States Patent
Sakong

(10) Patent No.: US 11,527,675 B2
(45) Date of Patent: Dec. 13, 2022

(54) SEMICONDUCTOR LIGHT EMITTING DEVICE HAVING A ROD SHAPE, AND DISPLAY APPARATUS INCLUDING THE SAME

(71) Applicant: SAMSUNG ELECTRONICS CO., LTD., Suwon-si (KR)

(72) Inventor: Tan Sakong, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 156 days.

(21) Appl. No.: 16/749,356

(22) Filed: Jan. 22, 2020

(65) Prior Publication Data

US 2020/0403119 A1    Dec. 24, 2020

(30) Foreign Application Priority Data

Jun. 24, 2019    (KR) ........................ 10-2019-0075013

(51) Int. Cl.
| | |
|---|---|
| *H01L 33/20* | (2010.01) |
| *H01L 27/15* | (2006.01) |
| *H01L 33/42* | (2010.01) |
| *H01L 33/38* | (2010.01) |

(52) U.S. Cl.
CPC ............ *H01L 33/20* (2013.01); *H01L 27/153* (2013.01); *H01L 33/38* (2013.01); *H01L 33/42* (2013.01)

(58) Field of Classification Search
CPC ....................... H01L 33/20; H01L 33/38–387
See application file for complete search history.

(56) References Cited

U.S. PATENT DOCUMENTS

| | | |
|---|---|---|
| 6,372,608 B1 | 4/2002 | Shimoda et al. |
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,911,351 B2 | 6/2005 | Kidoguchi et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,123 B2 | 12/2006 | Kunisato et al. |
| 7,154,124 B2 | 12/2006 | Han et al. |
| 7,208,725 B2 | 4/2007 | Sherrer et al. |
| 7,288,758 B2 | 10/2007 | Sherrer et al. |

(Continued)

FOREIGN PATENT DOCUMENTS

JP    2000-058918 A    2/2000

*Primary Examiner* — Stephen M Bradley
(74) *Attorney, Agent, or Firm* — Lee IP Law, P.C.

(57) ABSTRACT

A semiconductor light emitting device includes a light emitting structure having a rod shape with first and second surfaces opposing each other and a side surface connected between the first and second surfaces, and including a first conductivity-type semiconductor providing the first surface, an active layer and a second conductivity-type semiconductor, a first electrode layer on a first region of the first surface of the light emitting structure and connected to the first conductivity-type semiconductor, the first region having a level that is vertically offset from a level of a second region adjacent thereto, and a second electrode layer connected to the second conductivity-type semiconductor.

18 Claims, 23 Drawing Sheets

(56) References Cited

U.S. PATENT DOCUMENTS

| | | |
|---|---|---|
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,138,001 B2 | 3/2012 | Watanabe |
| 8,179,938 B2 | 5/2012 | Kim |
| 8,188,493 B2 | 5/2012 | Li et al. |
| 8,263,987 B2 | 9/2012 | Choi et al. |
| 8,288,755 B2 | 10/2012 | Kim |
| 8,324,646 B2 | 12/2012 | Lee et al. |
| 8,399,944 B2 | 3/2013 | Kwak et al. |
| 8,415,689 B2 | 4/2013 | Lim |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,598,613 B2 | 12/2013 | Kim |
| 8,735,931 B2 | 5/2014 | Han et al. |
| 8,766,295 B2 | 7/2014 | Kim |
| 8,859,315 B2 | 10/2014 | Su et al. |
| 9,112,112 B2 * | 8/2015 | Do ............... H01L 33/08 |
| 2003/0116774 A1 | 6/2003 | Yamamoto et al. |
| 2008/0273562 A1 * | 11/2008 | Hasegawa ........ B82Y 20/00 |
| | | 372/44.01 |
| 2011/0254043 A1 * | 10/2011 | Negishi ........... H01L 33/20 |
| | | 257/99 |
| 2017/0358714 A1 * | 12/2017 | Seong ............. H01L 33/20 |
| 2018/0019377 A1 * | 1/2018 | Kim ............... H01L 33/38 |
| 2020/0395509 A1 * | 12/2020 | Nishiyama ....... H01L 33/24 |

* cited by examiner

I-I'

II1-II1'

SEMICONDUCTOR LIGHT EMITTING DEVICE HAVING A ROD SHAPE, AND DISPLAY APPARATUS INCLUDING THE SAME

CROSS-REFERENCE TO RELATED APPLICATION

Korean Patent Application No. 10-2019-0075013, filed on Jun. 24, 2019, in the Korean Intellectual Property Office, and entitled: "Semiconductor Light Emitting Device and Display Apparatus," is incorporated by reference herein in its entirety.

BACKGROUND

1. Field

Embodiments relate to a semiconductor light emitting device and a display apparatus.

2. Description of Prior Art

Semiconductor light emitting diodes (LEDs) are not only used as light sources for lighting devices but also as light sources for various electronic products. In detail, LEDs are widely used as light sources for various display apparatuses such as TVs, mobile phones, PCs, notebook PCs, PDAs and the like.

SUMMARY

Embodiments are directed to a semiconductor light emitting device, including a light emitting structure having a rod shape with first and second surfaces opposing each other and a side surface connected between the first and second surfaces, and including a first conductivity-type semiconductor providing the first surface, an active layer and a second conductivity-type semiconductor, a first electrode layer on a first region of the first surface of the light emitting structure and connected to the first conductivity-type semiconductor, the first region having a level that is vertically offset from a level of a second region adjacent thereto, and a second electrode layer connected to the second conductivity-type semiconductor.

Embodiments are also directed to a semiconductor light emitting device, including a light emitting structure having a rod shape with first and second surfaces opposing each other and a side surface connected between the first and second surfaces, and including first and second conductivity-type semiconductor layers providing the first and second surfaces, respectively, and an active layer disposed between the first and second conductivity-type semiconductor layers, a first electrode layer connected to the first conductivity-type semiconductor layer and disposed on a first region of the first surface of the light emitting structure, the first region having a level that is vertically offset relative to a level of a second region adjacent thereto, and a second electrode layer on the second surface of the light emitting structure and connected to the second conductivity-type semiconductor layer.

Embodiments are also directed to a semiconductor light emitting device, including a first conductivity-type semiconductor rod having a first surface and a second surface opposing each other, and a side surface connected between the first surface and the second surface, the first conductivity-type semiconductor rod including a first portion adjacent to the first surface and a second portion adjacent to the second surface, an active layer and a second conductivity-type semiconductor layer sequentially disposed on a side surface of the second portion of the first conductivity-type semiconductor rod, a first electrode layer connected to the first conductivity-type semiconductor rod and disposed in a first region of the first surface of the first conductivity-type semiconductor rod, the first region having a level that is vertically offset relative to a level of a second region adjacent thereto, and a second electrode layer disposed on the second conductivity-type semiconductor layer.

Embodiments are also directed to a display apparatus, including a plurality of pixels, a first electrode portion and a second electrode portion disposed in a pixel among the plurality of pixels, the first electrode portion being spaced apart from the second electrode portion with a semiconductor light emitting device according to an embodiment disposed therebetween such that a first electrode layer of the semiconductor light emitting device is connected to the first electrode portion and a second electrode layer of the semiconductor light emitting device is connected to the second electrode portion.

BRIEF DESCRIPTION OF DRAWINGS

Features will become apparent to those of skill in the art by describing in detail example embodiments with reference to the attached drawings in which:

FIG. 16 illustrates a plan view of a process resultant (after regrowth) illustrated in

FIG. 14A;

DETAILED DESCRIPTION

Figure 1:
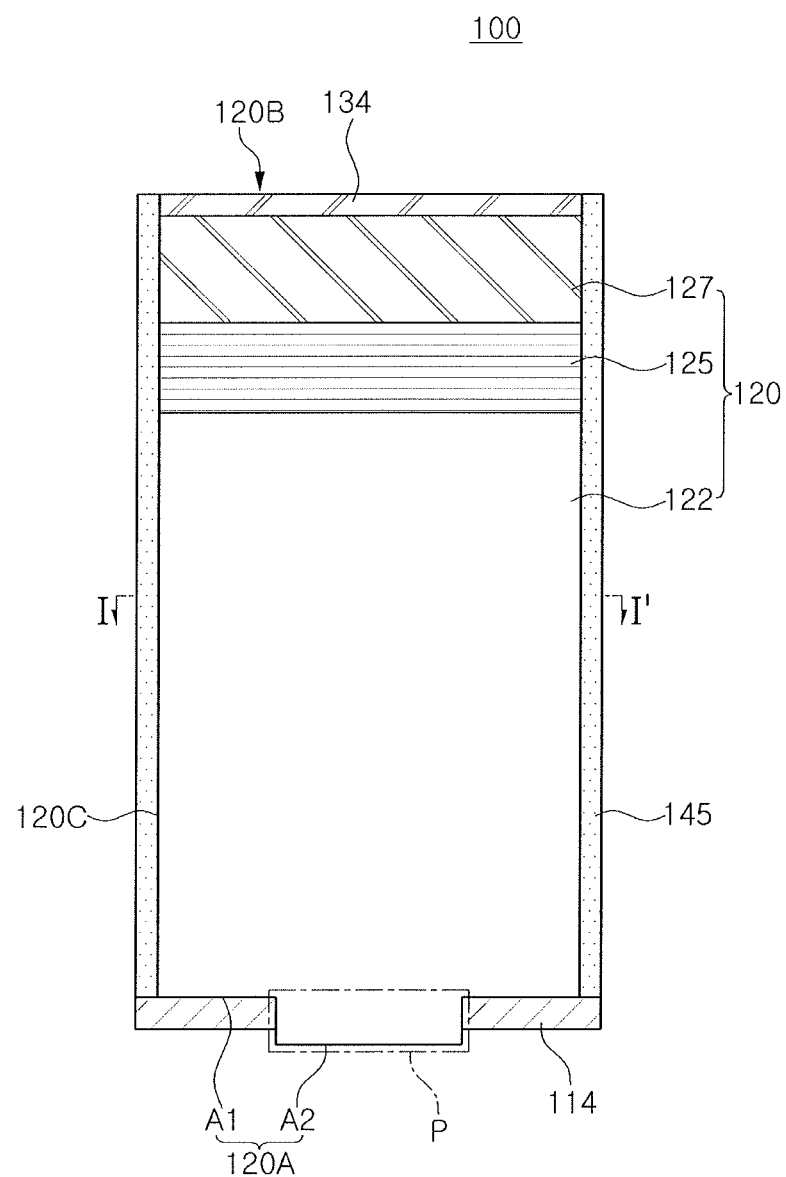
FIG. 1 illustrates a side cross-sectional view of a semiconductor light emitting device according to an example embodiment.
Figure 2A:
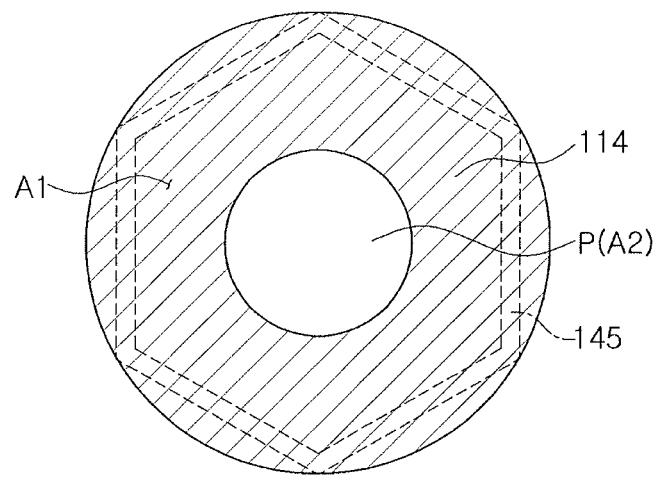
FIG. 2A illustrates a plan view (of a first surface) of the semiconductor light emitting device of FIG. 1.
Figure 2B:
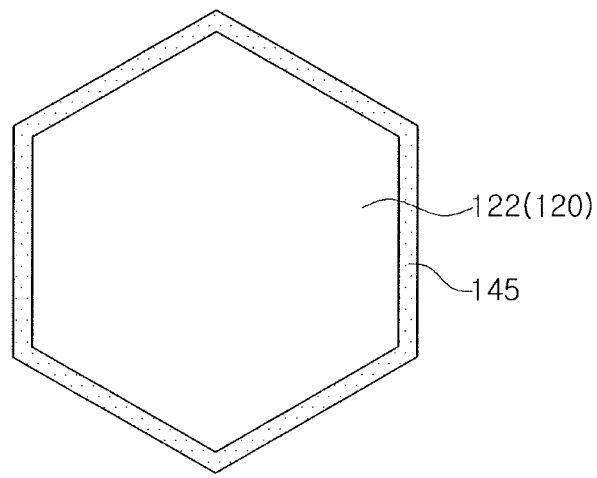
FIG. 2B illustrates a cross-sectional view taken along line I-I' of the semiconductor light emitting device of FIG. 1.

FIG. 1 is a side cross-sectional view illustrating a semiconductor light emitting device according to an example embodiment, FIG. 2A is a plan view (illustrating a first surface) of the semiconductor light emitting device of FIG. 1, and FIG. 2B is a cross-sectional view of the light emitting device, taken along line I-I' of FIG. 1.

Referring to FIG. 1, a semiconductor light emitting device 100 according to an example embodiment may include a light emitting structure 120 that includes a first conductivity-type semiconductor 122, an active layer 125, and a second conductivity-type semiconductor 127.

According to the present example embodiment, the light emitting structure 120 has a rod shape with a first surface 120A, a second surface 120B opposing the first surface 120A, and a side surface 120C connected between the first surface 120A and the second surface 120B.

At the first surface 120A, the first conductivity-type semiconductor 122 may have a first region A1 and a second region A2. In the first region A1, the first surface 120A may be flat but, considering both the first region A1 and the second region A2, the first surface 120A may be a non-flat surface overall. The first conductivity-type semiconductor 122 may have a protruding structure P in the second region A2 (for example, downwardly protruding in FIG. 1) such that, in the second region A2, the first conductivity-type semiconductor 122 projects beyond, and is vertically offset relative to, the surface in the first region A1, which may have a lower level than a level of the second region A2.

An ohmic contact layer 114 may be connected to the first conductivity-type semiconductor 122 and may serve as a first electrode layer. The ohmic contact layer 114 may be disposed in the first region A1 and adjacent to the second region A2. A second electrode layer 134 may be connected to the second conductivity-type semiconductor 127.

As described above, the ohmic contact layer 114 in the present example embodiment may be provided on the first conductivity-type semiconductor 122 at the first surface 120A of the light emitting structure 120. As illustrated in FIG. 1, the protruding structure P positioned in the second region A2 of the first surface 120A may protrude to be higher than, or protrude beyond, the ohmic contact layer 114 (that is, beyond the first electrode layer) with respect to a vertical direction in FIG. 1. As described below, the first region A1 of the first surface 120A may correspond to a crystal plane that is obtained when the nanorod type light emitting structure 120 is separated from a substrate during manufacturing, and the second region A2 of the first surface 120A may be a cleavage plane of the first conductivity-type semiconductor 122.

As illustrated in FIG. 2A, at the first surface 120A of the light emitting structure 120, the first region A1 may be disposed to surround, for example, completely encircle, the second region A2. As such, since the second region A2 is surrounded by the first region A1 that is already separated, the second region A2 may be easily separated even by thermal or mechanical impact.

Referring again to FIG. 1, the first and second conductivity-type semiconductors 122 and 127 and the active layer 125 may be nitride semiconductors, and the light emitting structure 120 may be a nitride light emitting structure. The first and second conductivity-type semiconductors 122 and 127 may also be referred to as "first and second conductivity-type semiconductor layers," respectively.

The first conductivity-type semiconductor 122 may be a nitride semiconductor layer satisfying n-type $In_xAl_yGa_{1-x-y}N$ ($0 \leq x < 1$, $0 \leq y < 1$, $0 \leq x+y < 1$), and n-type impurities may be silicon (Si). For example, the first conductivity-type semiconductor 122 may include an n-type GaN layer.

The second conductivity-type semiconductor 127 may be a nitride semiconductor layer that satisfies p-type $In_xAl_yGa_{1-x-y}N$ ($0 \leq x < 1$, $0 \leq y < 1$, $0 \leq x+y < 1$), and p-type impurities may be magnesium (Mg). In an example embodiment, the second conductivity-type semiconductor 127 may be implemented in a single layer structure, but in another embodiment, the second conductivity-type semiconductor 127 may have a multilayer structure having different compositions.

The active layer 125 may have a multi-quantum well (MQW) structure in which a quantum well layer and a quantum barrier layer are alternately stacked. For example, the quantum well layer and the quantum barrier layer may be an $In_xAl_yGa_{1-x-y}N$ ($0 \leq x \leq 1$, $0 \leq y \leq 1$, $0 \leq x+y \leq 1$) layer having different compositions. In a specific example, the quantum well layer may be an $In_xGa_{1-x}N$ ($0 < x \leq 1$) layer, and the quantum barrier layer may be a GaN or AlGaN layer. A thickness of each of the quantum well layer and the quantum barrier layer may range from 1 nm to 50 nm. In another example embodiment, the structure of the active layer 125 may be a single quantum well structure.

As illustrated in FIG. 2A, the ohmic contact layer 114, which is the first electrode layer positioned in the first region A1, may have a ring shape. The ring shape of the ohmic contact layer 114 may be, for example, circular.

In the present example embodiment, a cross-sectional width of the light emitting structure 120 may be smaller than an outer width of the ohmic contact layer 114, which may be understood to be a result of additional etching by wet etching (see FIG. 5F) to remove a surface damage region after dry etching (see FIG. 5E) to form a nanorod-shaped light emitting structure 120.

Referring to FIG. 2B, the nanorod-shaped cross section of the light emitting structure 120 (a cross section taken along line I-I') may have a hexagonal structure. For example, the light emitting structure 120 may be formed of a nitride semiconductor and thus may have a hexagonal columnar structure. The second surface 120B of the light emitting structure 120 may be positioned inside the outer edge line of the circular ring-shaped ohmic contact layer 114.

Figure 3:
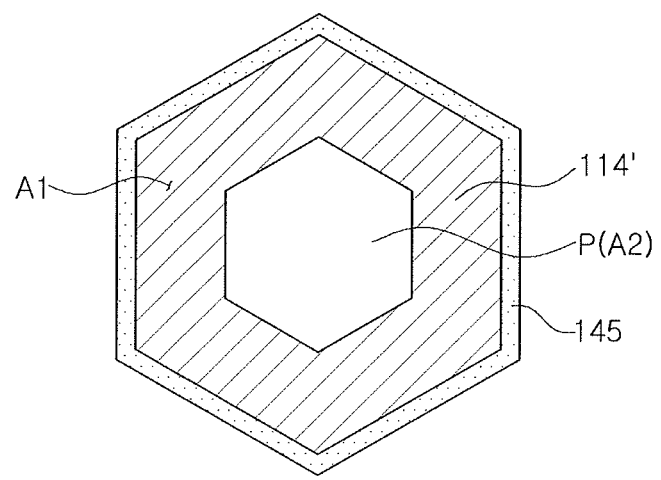
FIG. 3 illustrates a plan view (of a first surface) of a semiconductor light emitting device according to an example embodiment.

In another example embodiment, as illustrated in FIG. 3, the ohmic contact layer 114 may also have a hexagonal ring structure. The ohmic contact layer 114 may also be disposed along an outline of the first surface 120A of the light emitting structure 120. In a specific example, a hexagonal cross section of the light emitting structure 120 may be smaller than an outer hexagonal-shaped area of the ohmic contact layer 114.

The shape of the ohmic contact layer 114 may have various other patterns. Similarly, although the light emitting structure 120 in the present example embodiment is illustrated as having a hexagonal columnar structure, the light emitting structure 120 may also have a cylindrical shape or various other shapes depending on an etching process (see FIG. 5E) and a post-treatment process (see FIG. 5F) to form a semiconductor crystal structure and/or nanorods constituting the light emitting structure 120.

The first electrode layer in the present example embodiment may include the ohmic contact layer 114 connected to the first conductivity-type semiconductor 122. The ohmic contact layer 114 may include, for example, at least one of silver (Ag), aluminum (Al), nickel (Ni), chromium (Cr), copper (Cu), gold (Au), palladium (Pd), platinum (Pt), tin (Sn), tungsten (W), rhodium (Rh), iridium (Ir), ruthenium (Ru), magnesium (Mg), zinc (Zn) and alloy materials thereof. In an example embodiment, the ohmic contact layer 114 may include W or WSi.

The second electrode layer 134 may be disposed at the second surface 120B of the light emitting structure 120 to be connected to the second conductivity-type semiconductor 127. The second electrode layer 134 may be disposed almost entirely on the second surface 120B of the light emitting structure 120. The second electrode layer 134 may include, for example, Ag, Ni, Al, Cr, Rh, Pd, Ir, Ru, Mg, Zn, Pt, or Au, and may be employed in the structure of a single layer or two or more layers. In an example embodiment, the second electrode layer 134 may be a transparent electrode formed of a transparent conductive oxide or a transparent conductive nitride, or may include graphene. For example, the second electrode layer 134 may include at least one selected from indium tin oxide (ITO), zinc-doped indium tin oxide (ZITO), zinc indium oxide (ZIO), gallium indium oxide (GIO), zinc tin oxide (ZTO), or fluorine-doped tin oxide (FTO), aluminum-doped zinc oxide (AZO), gallium-doped zinc oxide (GZO), $In_4Sn_3O_{12}$, and $Zn_{(1-x)}Mg_xO$ (Zinc Magnesium Oxide, $0 \leq x \leq 1$).

The semiconductor light emitting device 100 according to the present example embodiment may include a passivation layer 145 disposed on the side surface 120C of the light emitting structure 120. The passivation layer 145 may include, for example, an insulating material such as $SiO_2$, SiN, $TiO_2$ and/or AlN. In another example, the passivation layer 145 may include low conductivity semiconductor materials such as AlGaN, undoped GaN, Mg-doped AlN, Mg-doped AlGaN, and Mg-doped GaN.

The semiconductor light emitting device 100 according to the present example embodiment may include the ohmic contact layer 114 serving as the first electrode layer, and the second electrode layer 134, while having the nanorod structure. The ohmic contact layer 114 may be provided before the growth of the light emitting structure 120. Thus, the ohmic contact layer 114 may have a form embedded in the first surface 120A of the light emitting structure 120, for example, in the first conductivity-type semiconductor 122. The ohmic contact layer 114 may be formed in the first region A1 of the first surface 120A of the light emitting structure 120, and the second region A2 may be a cleavage plane obtained when separating the semiconductor light emitting device 100 from the substrate. Although somewhat different depending on the crystal plane split upon separation from the substrate, the second region A2 may have a structure protruding to be higher than, or protruding beyond, the first region A1 with respect to a vertical direction in FIG. 1. In addition, the second region A2 may have a structure surrounded by the first region A1, such that separation may easily occur in the second region A2.

Figure 4:
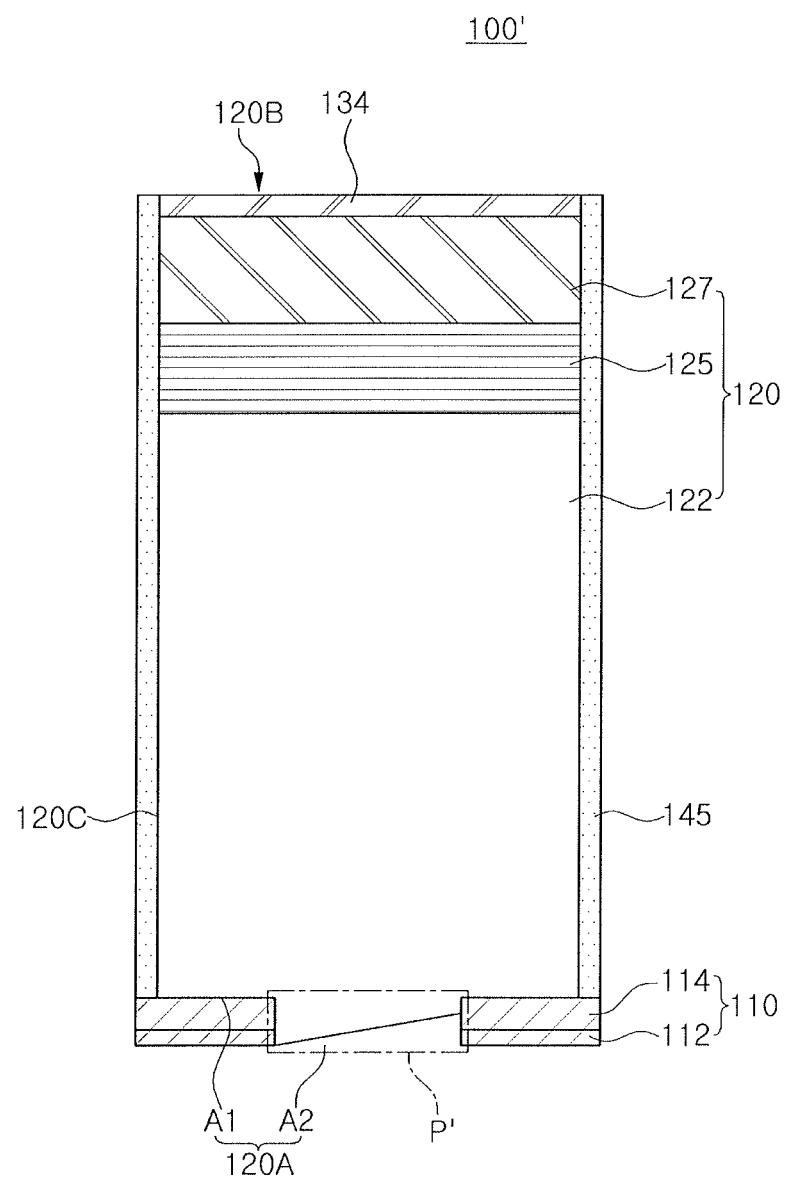
FIG. 4 illustrates a side cross-sectional view of a semiconductor light emitting device according to an example embodiment.

FIG. 4 is a side cross-sectional view illustrating a semiconductor light emitting device according to an example embodiment.

Referring to FIG. 4, a semiconductor light emitting device 100' according to an example embodiment may be similar to the semiconductor light emitting device 100 illustrated in FIGS. 1 to 3, with the exceptions that the protruding structure P' has a different shape and a first electrode layer 110 has a multilayer structure. The components of the present example embodiment may be understood with reference to the description of the same or similar components of the semiconductor light emitting device 100 illustrated in FIGS. 1 to 3 unless otherwise stated.

The semiconductor light emitting device 100' according to the present example embodiment has a protruding structure P' that protrudes at the first surface 120A of the light emitting structure 120. Similar to the previous embodiment with reference to FIGS. 1 to 3, the first region A1 (in which the first electrode layer 110 is disposed) may have a level than, or be vertically offset, relative to the second region A2.

As illustrated in FIG. 4, the protruding structure P' may be formed to partially exposed an inner side surface of the first electrode layer 110, unlike the previous embodiment. The protruding structure P' may be a surface obtained by separating the light emitting structure 120 from the substrate by concentrating stress on a portion surrounded by the first electrode layer 110, and thus, may be divided into various shapes due to the presence of existing cracks (for example, crystal defects) or the like. For example, as in the present example embodiment, the first surface 120A may have an oblique surface in the second region A2.

The first electrode layer 110 may be embedded in a first conductivity-type semiconductor 122 in the first surface 120A of the light emitting structure 120. The first electrode layer 110 in the present example embodiment may have a multilayer structure. The first electrode layer 110 may include the ohmic contact layer 114 connected to the first conductivity-type semiconductor 122 and a metal nitride layer 112 disposed on the ohmic contact layer 114.

The ohmic contact layer 114 may include, for example, at least one of Ag, Al, Ni, Cr, Cu, Au, Pd, Pt, Sn, W, Rh, Ir, Ru, Mg, Zn, and alloy materials thereof. In an example embodiment, ohmic contact layer 114 may include W or WSi.

The metal nitride layer 112 may include, for example, TiN, TaN or WN as a conductive layer. The metal nitride layer 112 may be understood to be a layer formed as a metal layer (for example, a titanium (Ti), tantalum (Ta) or W layer) that reacts with a nitrogen component of the substrate during the growth of the light emitting structure 120 (see FIG. 5B). In an example embodiment, the metal nitride layer 112 may be selectively removed in such a manner that only the ohmic contact layer 114 remains as the first electrode layer (see FIG. 1).

FIGS. 5A to 5I are cross-sectional views of main processes illustrating a method of manufacturing a semiconductor light emitting device according to an example embodiment.

Figure 5A:
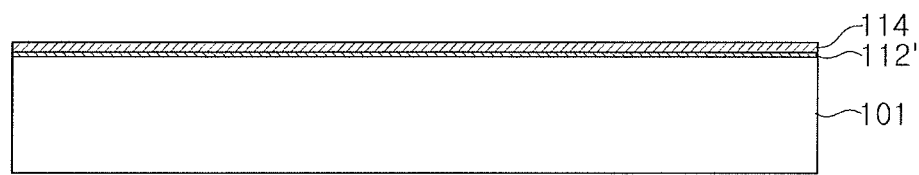
FIGS. 5A through 5I illustrate cross-sectional views of stages in a method of manufacturing a semiconductor light emitting device according to an example embodiment.

Referring to FIG. 5A, a nitride single crystal substrate 101 may be used as a growth substrate containing a nitrogen component. For example, the nitride single crystal substrate may include a nitride single crystal satisfying $In_xAl_yGa_{1-x-y}N$ ($0 \leq x < 1$, $0 \leq y < 1$, $0 \leq x+y < 1$). In an example embodiment, the nitride single crystal substrate 101 may be a GaN substrate.

A metal layer 112' and a material layer for the ohmic contact layer 114 may be sequentially formed on a nitride single crystal substrate 101. The metal layer 112' and the material for the ohmic contact layer 114 may be deposited on the nitride single crystal substrate 101 using, for example, chemical vapor deposition (CVD) or sputtering.

The metal layer 112' may include a metal capable of reacting with the nitrogen component of the nitride single crystal substrate 101 to form a metal nitride under single crystal growth conditions for the light emitting structure. For example, the metal layer 112' may include Ta, Ti or W. The metal layer 112' may be used to form the above-described metal nitride layer 112.

The ohmic contact layer 114 may be formed using an electrode material capable of forming ohmic contact with the first conductivity-type semiconductor 122 of the light emitting structure 120. The ohmic contact layer 114 may include, for example, at least one of Ag, Al, Ni, Cr, Cu, Au, Pd, Pt, Sn, W, Rh, Ir, Ru, Mg, Zn, and alloy materials thereof. In an example embodiment, the ohmic contact layer 114 may include W or WSi.

Figure 5B:
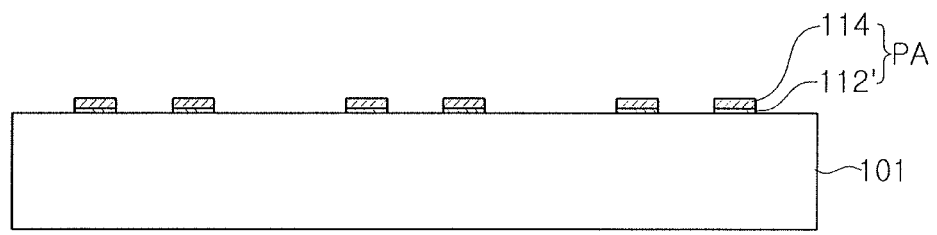
Figure 6:
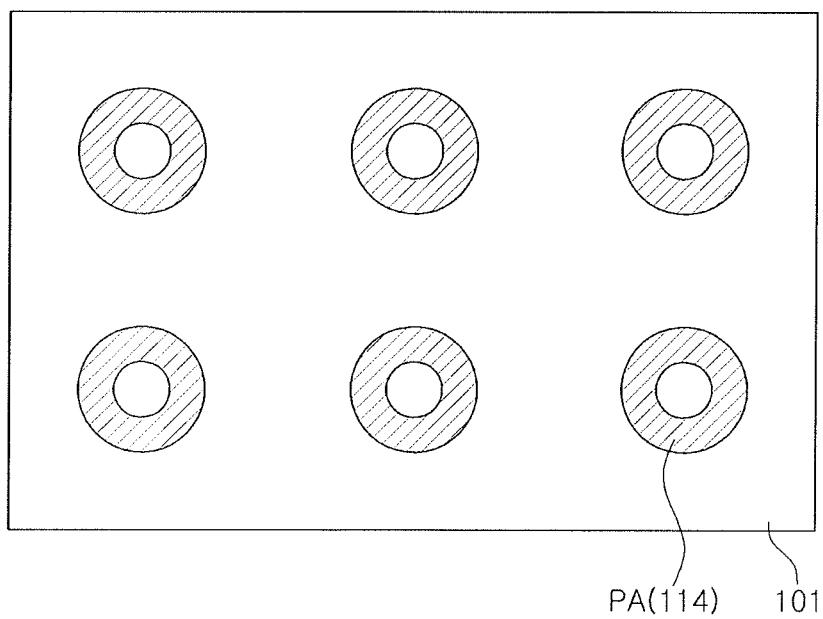
FIG. 6 illustrates a plan view of an arrangement of patterns illustrated in FIG. 5B.

Referring to FIG. 5B, a predetermined pattern PA may be formed by patterning the metal layer 112' and the material for the ohmic contact layer 114. FIG. 6 is a plan view illustrating an arrangement of patterns PA illustrated in FIG. 5B.

Each pattern PA may have a ring shape surrounding one region. In the present example embodiment, each pattern PA may have a ring shape that is circular, as illustrated in FIG. 6. Each pattern PA may define a region of the first electrode layer for the light emitting structure of the nanorod structure. For example, each pattern PA may define the first region A1 in which the first electrode layer is to be formed on the first surface 120A of a final light emitting structure 120 illustrated in FIG. 2A.

Figure 5C:
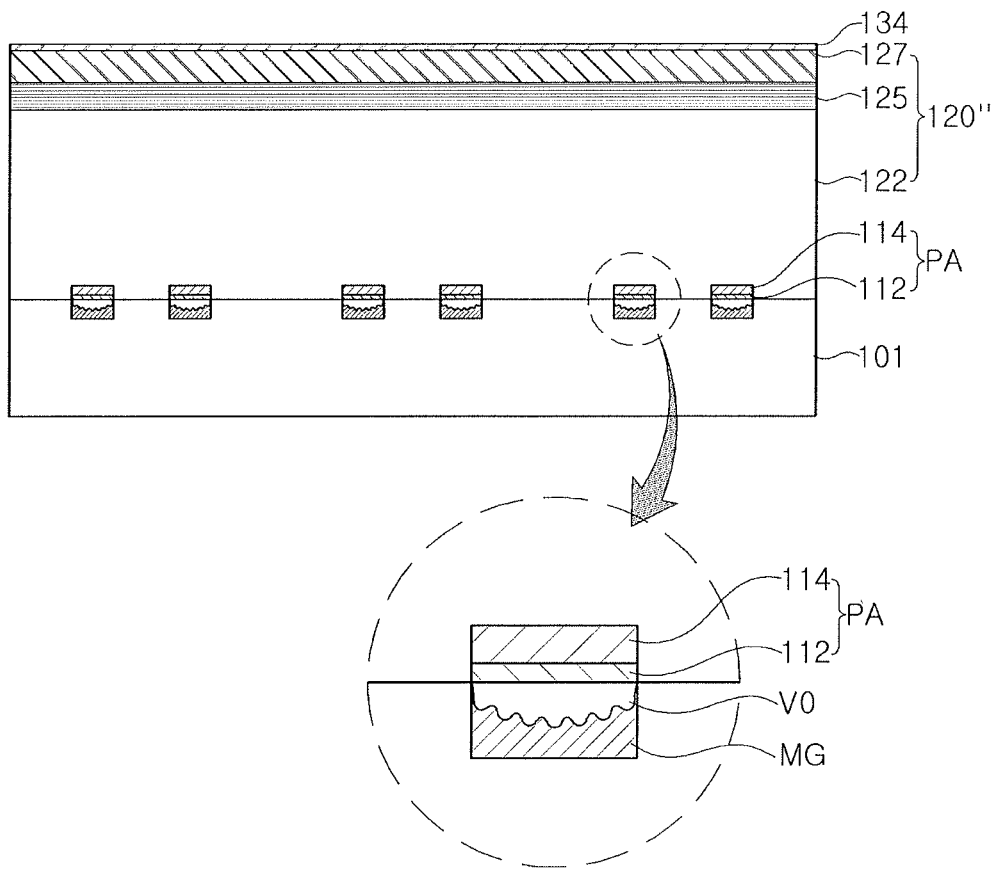
Figure 5D:
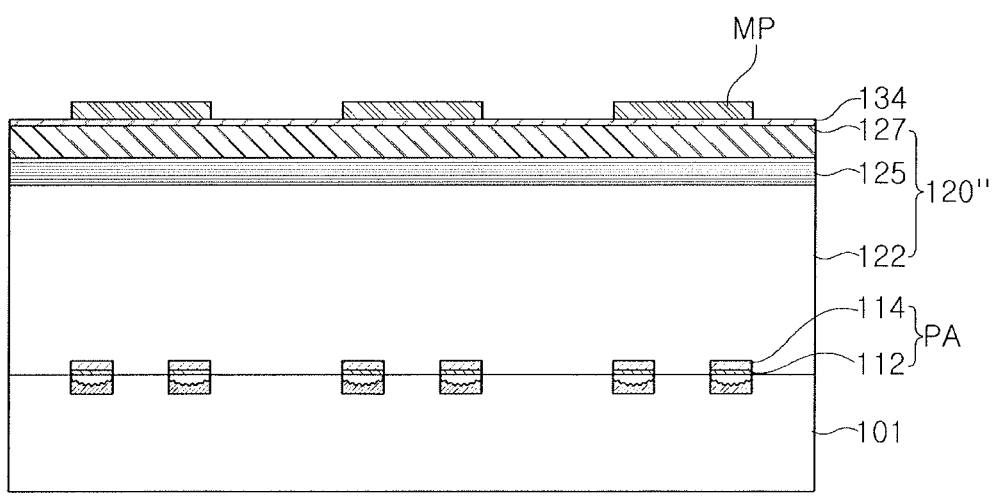
Figure 5E:
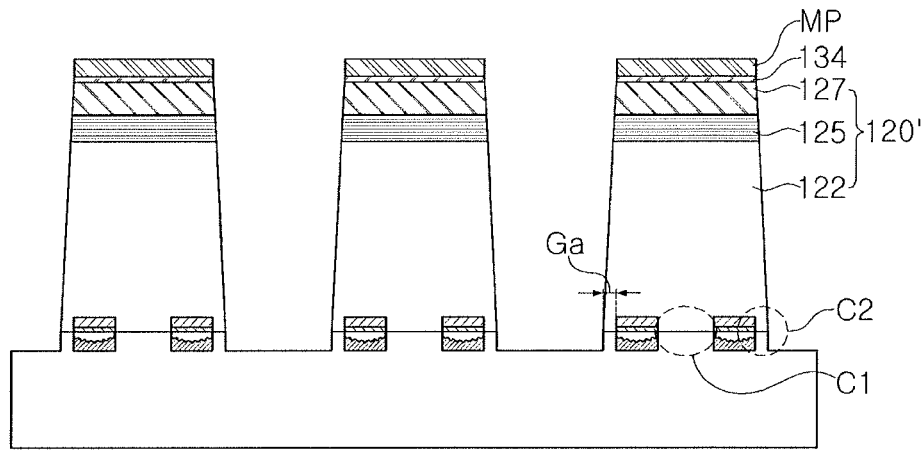
Figure 5F:
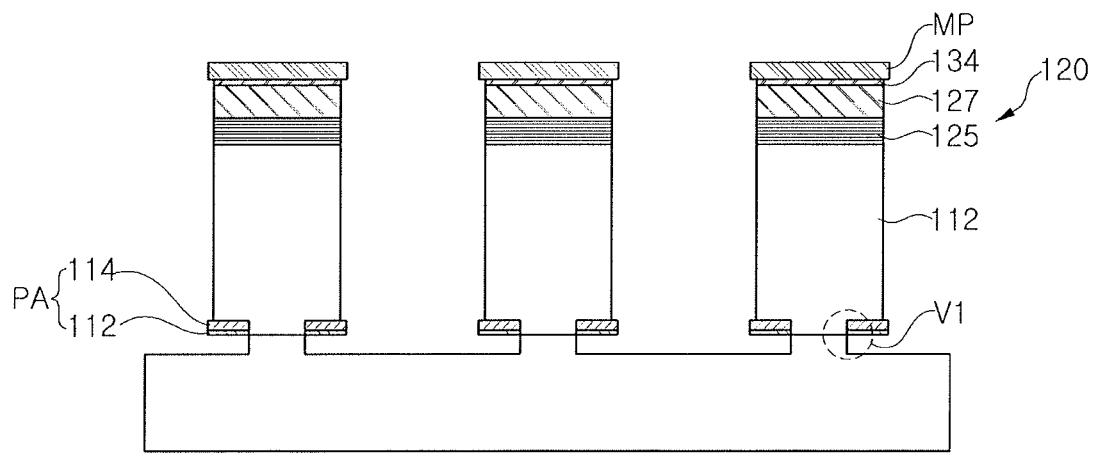
Figure 5G:
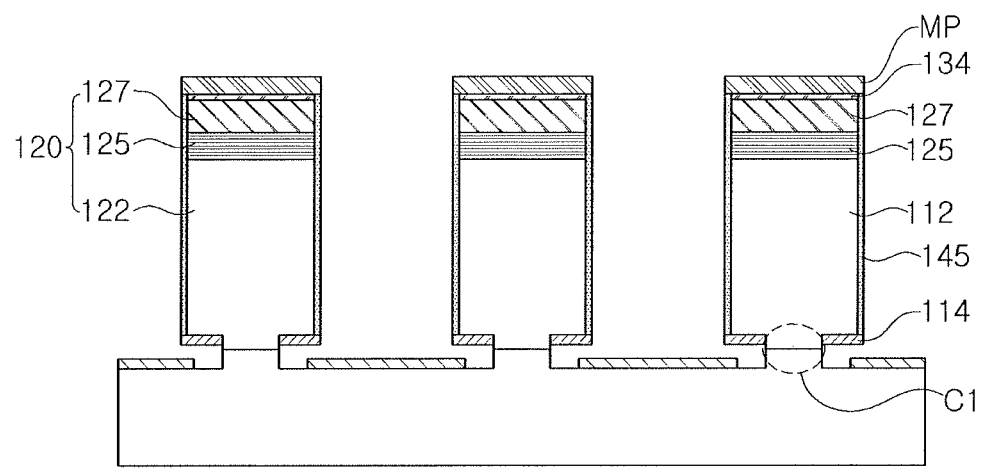
Figure 5H:
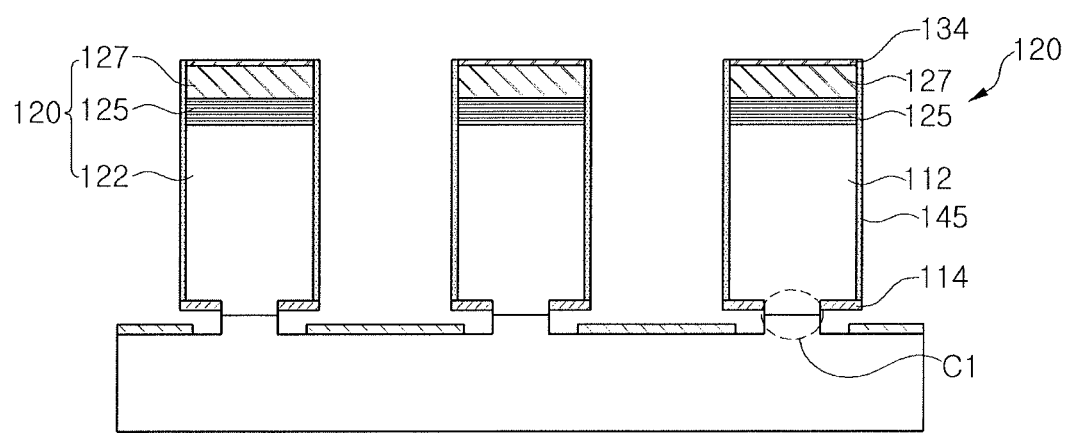
Figure 5I:
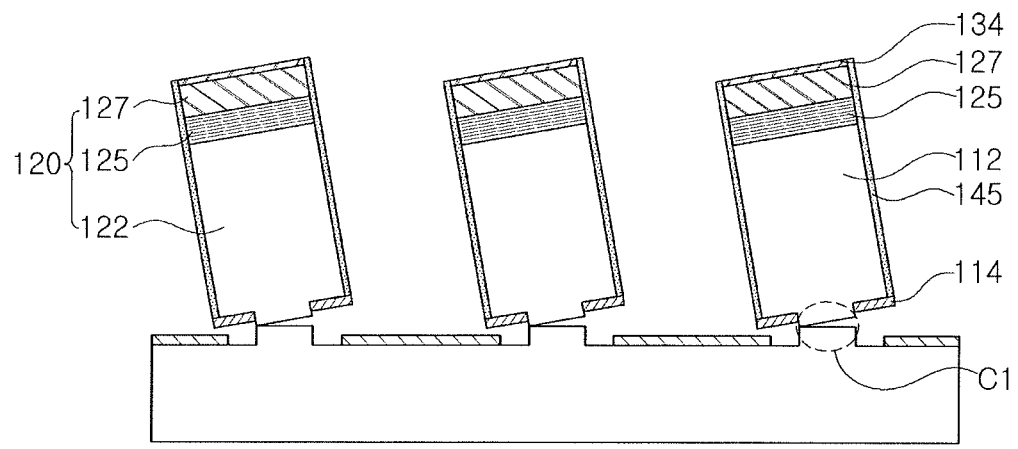

The region surrounded by each pattern PA may be used as a temporary support area for the light emitting structure after an etching process for nanorods (see FIG. 5E), and may be used as a separation area that is split by brittleness when the light emitting structure is separated from the substrate (see FIG. 5I). Accordingly, the shape of respective patterns PA may be a completely surrounded ring shape, or may be a shape formed by a pattern of another shape (for example, a semicircular shape) which is only partially surrounded or which occupies a portion while remaining regions are utilized as temporary support regions and separation regions.

Referring to FIG. 5C, the first conductivity-type semiconductor 122, the active layer 125, and the second conductivity-type semiconductor 127 are sequentially formed on the nitride single crystal substrate 101 in which the ring pattern PA is formed.

A semiconductor stack 120" including the first conductivity-type semiconductor 122, the active layer 125, and the second conductivity-type semiconductor 127 may be provided as the light emitting structure 120 in a subsequent process. The conductivity-type semiconductor 122, the active layer 125 and the second conductivity-type semiconductor 127 may be formed of a nitride single crystal as described above. The semiconductor stack 120" may be formed by, for example, a metal organic chemical vapor deposition (MOCVD) process.

The semiconductor stack 120" may be formed to cover the pattern PA using side overgrowth, for example, epitaxial, laterally-overgrown (ELOG). A merging process (for example, growth time) and the resulting defect location may be appropriately set by appropriately selecting a width and/or a location of the pattern PA.

The growth process may be performed at a high temperature, for example, at 800° C. or higher. Thus, nitrogen in a region of the nitride single crystal substrate 101 adjacent to the metal layer 112' may be migrated to the metal layer 112' to react with the metal layer 112', thereby forming the metal nitride layer 112 in the growth process. The metal nitride layer 112 may include, for example, TiN, TaN or WN. As a result of this reaction, vacancies due to nitrogen migration may be generated in the region of the nitride single crystal substrate 101 adjacent to the metal layer 112', and a metal component, for example, gallium, remaining in the high temperature process may be melted to form a void region V0. The void region V0 may be formed by a pattern region in contact with the metal layer (or the metal nitride layer 112), and may facilitate separation of the light emitting structure 120 in a subsequent process (see FIG. 5I).

Referring to FIG. 5D, a second electrode layer 134 may be formed on the semiconductor stack 120", and a mask pattern MP may be formed on the second electrode layer 134.

The second electrode layer 134 may be deposited on the semiconductor stack 120" to be connected to the second conductivity-type semiconductor 127. For example, the second electrode layer 134 may include Ag, Ni, Al, Cr, Rh, Pd, Ir, Ru, Mg, Zn, Pt, or Au, and may be employed in the structure of a single layer or two or more layers. In the present example embodiment, the second electrode layer 134 may also include a transparent electrode layer such as a transparent conductive oxide layer or a transparent conductive nitride layer. For example, the second electrode layer 134 may be at least one selected from indium tin oxide (ITO), zinc-doped indium tin oxide (ZITO), Zinc Indium Oxide (ZIO), Gallium Indium Oxide (GIO), Zinc Tin Oxide (ZTO), Fluorine-doped Tin Oxide (FTO), Aluminum-doped Zinc Oxide (AZO), Gallium-doped Zinc Oxide (GZO), $In_4Sn_3O_{12}$, and $Zn_{(1-x)}Mg_xO$ (Zinc Magnesium Oxide, $0 \leq x \leq 1$) layers. Next, the mask pattern MP for formation of a light emitting structure may be formed on the second electrode layer 134.

Figure 7:
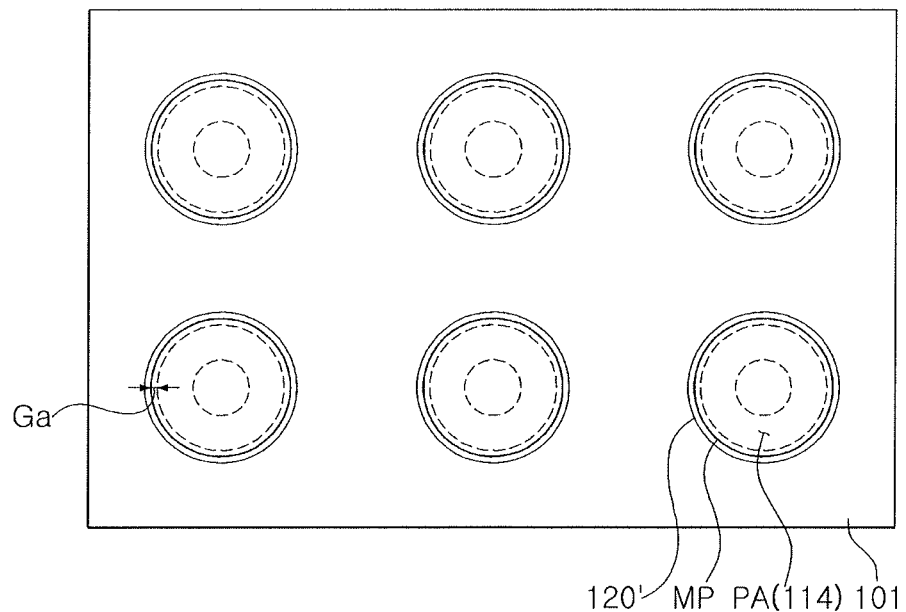
FIG. 7 illustrates a plan view of a process resultant (after etching to form nanorods) illustrated in FIG. 5E.

Referring to FIG. 5E, a preliminary light emitting structure 120' having a nanorod structure may be formed by etching the semiconductor stack 120". FIG. 7 is a plan view illustrating the process result (after nanorod etching) illustrated in FIG. 5E.

The preliminary light emitting structure 120' having a nanorod structure may be formed from the semiconductor stack 120" by using an etching process using the mask pattern MP. For example, as this etching process, a dry etching process such as an Inductively Coupled Plasma-Reactive Ion Etching (ICE-RIE) plasma etching process may be used.

The mask pattern MP provided in the foregoing process may be, for example, a circular pattern. As in the present example embodiment, in a subsequent process of performing an etching process (see FIG. 5F) to remove a surface damage region, the mask pattern MP may have a size slightly larger than a cross-sectional area of the final light emitting structure 120 (or an outline size of the pattern PA). After this process, as illustrated in FIGS. 5E and 7, the preliminary light emitting structure 120' corresponding to the mask pattern MP may be formed to have a substantially cylindrical structure. The preliminary light emitting structure 120' of the cylindrical structure may be provided to have a larger area (by a gap Ga) than that of an outer edge of the pattern PA disposed therebelow. This gap Ga may be set in consideration of a portion to be removed in a subsequent etching process in which the surface damage region is to be removed. The preliminary light emitting structure 120' may be further removed in a subsequent etching process, and thus, the preliminary light emitting structure 120' may be fixed to the nitride single crystal substrate 101 by a connection portion C2 located on an outer circumference in addition to a connection portion C1 surrounded by the patterns PA.

Figure 8:
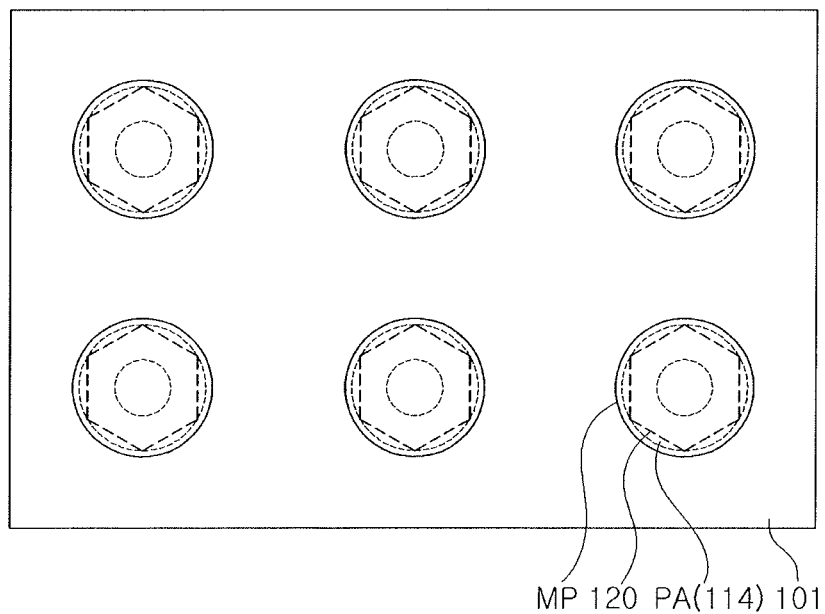
FIG. 8 illustrates a plan view of a process resultant (after wet etching for removing a damaged layer) illustrated in FIG. 5F.

Referring to FIG. 5F, a damaged surface of the nanorod structure preliminary light emitting structure 120' may be removed to form the light emitting structure 120 having a predetermined nanorod structure. FIG. 8 is a plan view illustrating a process resultant (after wet etching) illustrated in FIG. 5F.

The removal of the damaged surface in the previous etching process may be performed by, for example, wet etching. For example, the wet etching may use KOH and/or phosphoric acid. In this process, the side surface of the preliminary light emitting structure 120', having a cylindrical structure, has a stable crystal surface (for example, an M surface) in the wet etching process, and thus may be formed as the light emitting structure 120 having a hexagonal columnar structure. In a subsequent etching process, the outer circumferential connection portion C2 located on a lower end portion of the light emitting structure 120' is additionally removed, and thus, the light emitting structure 120 may have a separation region V1 obtained as a void region V0 is formed by expanding along a lower end outer periphery of the light emitting structure 120. In this etching process, the metal nitride layer 112 may serve as a protective layer of the ohmic contact layer 114.

Referring to FIG. 5G, the passivation layer 145 may be formed on the surface of the light emitting structure 120 having the nanorod structure.

The passivation layer 145 may be deposited on the surface of the light emitting structure 120. As in the present example embodiment, the passivation layer 145 may be formed on an upper surface of the light emitting structure 120 and an upper surface of the nitride single crystal substrate 101 between the light emitting structures 120, as well as a side surface of the light emitting structure 120. The portions of the passivation layer 145 located on the upper surface of the light emitting structure 120 and on the upper surface of the nitride single crystal substrate 101 between the light emitting structures 120 may be removed in a subsequent process. For example, the passivation layer 145 may include an insulating material such as $SiO_2$, SiN, $TiO_2$, and/or AlN. In another example, the passivation layer 145 may include a semiconductor material having relatively low conductivity.

Referring to FIG. 5H, the passivation layer 145 may be selectively removed in a non-required region to expose the second electrode layer 134.

Through this process, the mask pattern MP may be removed to expose the second electrode layer 134, and the passivation layer 145 may remain on the side surface of the light emitting structure 120. In addition, in this process, the metal nitride layer 112 may be removed and the ohmic contact layer 114 may be exposed. Although illustrated as a process of removing the metal nitride layer 112 in this process, the metal nitride layer 112 may be a conductive layer such as TiN, TaN and WN layers, and since the ohmic contact layer 114 in contact with the first conductivity-type semiconductor 122 may be present, the metal nitride layer 112 may remain to form the first electrode layer 110 together with the ohmic contact layer 114.

Referring to FIG. 5I, a semiconductor light emitting device having a nanorod structure may be separated from the nitride single crystal substrate 101.

The light emitting structure 120 may be separated from the nitride single crystal substrate 101 by, for example, concentrating stress on the connection portion C1 of the light emitting structure 120 and the nitride single crystal substrate 101 such that the connection portion C1 is split. Such stress may be provided by relatively low thermal or mechanical impacts.

According to the present example embodiment, the connection portion C1 is surrounded by the already-separated pattern PA, and may thus be easily separated therefrom. As described above, the separated surface of the light emitting structure 120 (corresponding to region A2 in FIG. 1) may be a cleavage plane or a surface in which stress is concentrated due to cracks. The separated surface (corresponding to region A2 in FIG. 1) of the light emitting structure 120 may have a level higher than (or protruding beyond, with respect to a vertical direction in FIG. 5I) a region corresponding to region A1 in FIG. 1 in which the ohmic contact layer 114 is formed. The ohmic contact layer 114 may also be understood to be embedded in the first conductivity-type semiconductor 122.

In the above example embodiment, the light emitting structure has a nanorod structure in which a first conductivity-type semiconductor layer, an active layer and a second conductivity-type semiconductor layer are sequentially stacked. In another example embodiment, the light emitting structure may have a structure in which the first conductivity-type semiconductor is provided as a main nanorod, and the active layer and the second conductivity-type semiconductor layer are sequentially formed on a side surface of the nanorod that is the first conductivity-type semiconductor, as shown in FIGS. 9 to 12 and described below.

Figure 9:
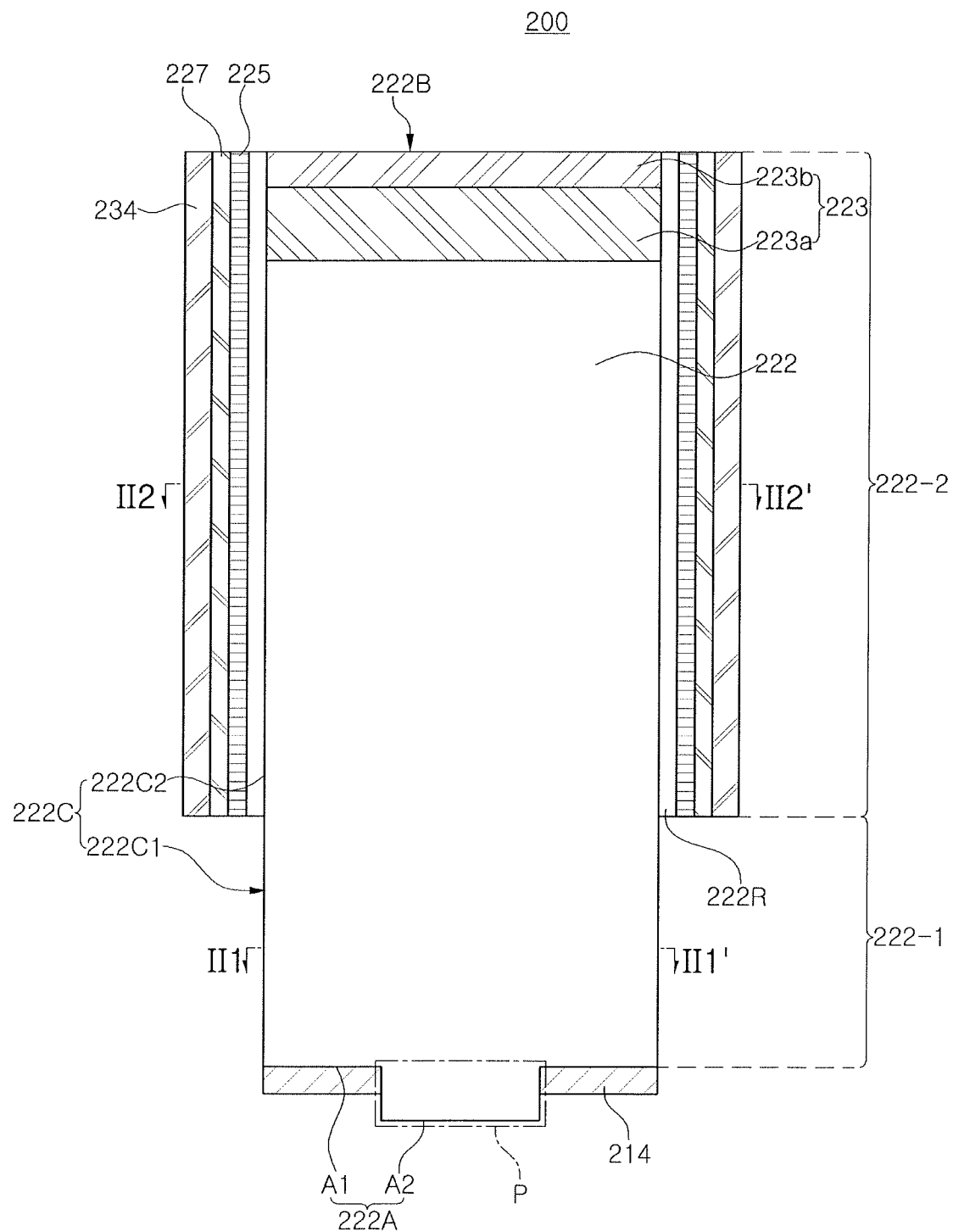
FIG. 9 illustrates a side cross-sectional view of a semiconductor light emitting device according to an example embodiment.
Figure 10A:
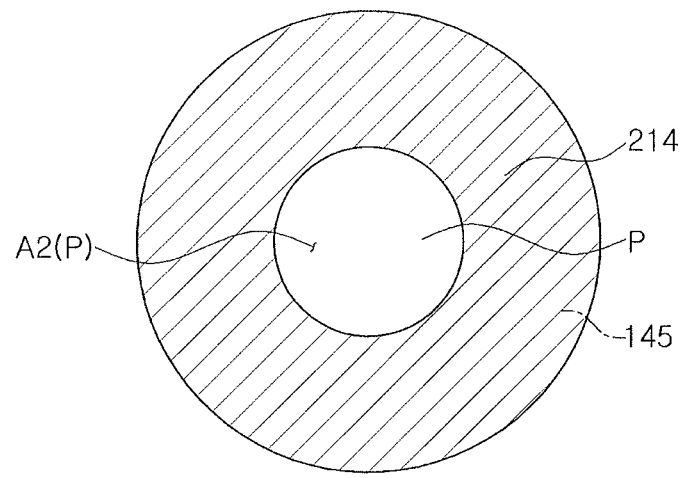
FIG. 10A illustrates a plan view (of a first surface) of the semiconductor light emitting device illustrated in FIG. 9, and FIGS. 10B and 10C illustrate cross-sectional views taken along lines II1-II1' and II2-II2' of the semiconductor light emitting device illustrated in FIG. 1.

FIG. 9 is a side cross-sectional view illustrating a semiconductor light emitting device according to an example embodiment, and FIG. 10A is a plan view (illustrating a first surface) of the semiconductor light emitting device illustrated in FIG. 9.

Referring to FIG. 9, a semiconductor light emitting device 200 according to an example embodiment may include a first conductivity-type semiconductor rod 222 having a first surface 222A and a second surface 222B opposing each other, and a side surface 222C connected between the first surface 222A and the second surface 222B, and a light emitting structure 220 including an active layer 225 and a second conductivity-type semiconductor layer 227 sequentially formed on a portion of the side surface 222C of the first conductivity-type semiconductor rod 222. The first conductivity-type semiconductor rod 222 includes a first portion 222_1 adjacent to the first surface 222A and a second portion 222_2 adjacent to the second surface 222B, and the active layer 225 and the second conductivity-type semiconductor layer 227 may be disposed on a side surface of the second portion 222_2 adjacent to the second surface 222B.

The semiconductor light emitting device 200 further includes an ohmic contact layer 214, which is a first electrode layer disposed in a first region A1 of the first surface 222A of the first conductivity-type semiconductor rod 222, and a second electrode layer 234 connected to the second conductivity-type semiconductor layer 227.

In the first surface 222A of the first conductivity-type semiconductor rod 222, the first region A1 (in which the ohmic contact layer 214 is disposed) corresponds to a surface that has a lower level than, or is vertically offset relative to, the surface in the second region A2. The first surface 222A of the first conductivity-type semiconductor rod 222 may be a non-planar surface overall (having a protruding structure P in which the second region A2). The first region A1 of the first surface 222A may have a flat surface. The second surface 222B of the first conductivity-type semiconductor rod 222 may be a flat surface overall.

As described above, the ohmic contact layer 214 in the present example embodiment may be embedded in the first conductivity-type semiconductor rod 222 in the first surface 222A.

As illustrated in FIG. 9, the protruding structure P positioned in the second region A2 of the first surface 222A may protrude higher than, or beyond, the ohmic contact layer 214 (which is the first electrode layer) with respect to a vertical direction of FIG. 9. The first region A1 may be a crystal plane obtained when the nanorod-type light emitting structure 220 is separated from the substrate, and the second region A2 of the first surface 222A may be a cleavage plane of the first conductivity-type semiconductor 222.

As illustrated in FIG. 10A, in the first surface 222A of the first conductivity-type semiconductor rod 222, the first region A1 may surround the second region A2. As such, since the second region A2 is surrounded by the first region A1 that is already separated, the second region A2 may be easily separated even by thermal or mechanical impact.

According to the present example embodiment, in the light emitting structure 220, the first conductivity-type semiconductor rod 222, the second conductivity-type semiconductor layer 227, and the active layer 225 may be the nitride semiconductors described in the foregoing embodiment.

As illustrated in FIG. 10A, the first conductivity-type semiconductor rod 222 may have a cylindrical structure in which the first surface 222A has a substantially circular shape. The ohmic contact layer 214, which is the first electrode layer, may have a ring shape formed along an outer circumference of the first surface 222A. In another example embodiment, the structure of the first conductivity-type semiconductor rod 222 may have a columnar structure in which the first surface 222A has another polygonal shape, such as a quadrangular shape, and may be determined depending on a shape of a nanohole H of FIGS. 13C and 15.

Similarly, the ring shape of the ohmic contact layer 214 may have another polygonal shape. In the present example embodiment, the size of the first surface 222A of the first conductivity-type semiconductor rod 222 may be equal to or slightly smaller than the outer area of the ohmic contact layer 214.

The second portion 222_1 of the first conductivity-type semiconductor rod 222 may further include a regrowth layer 222R and may have a width and a shape different from those of the first portion 222_1.

Figure 10B:
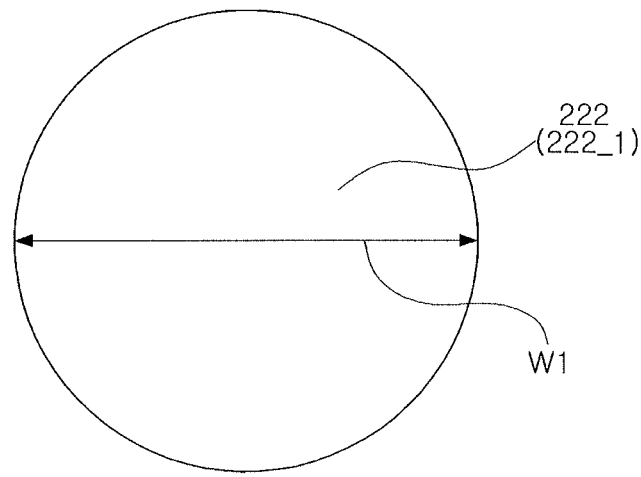
Figure 10C:
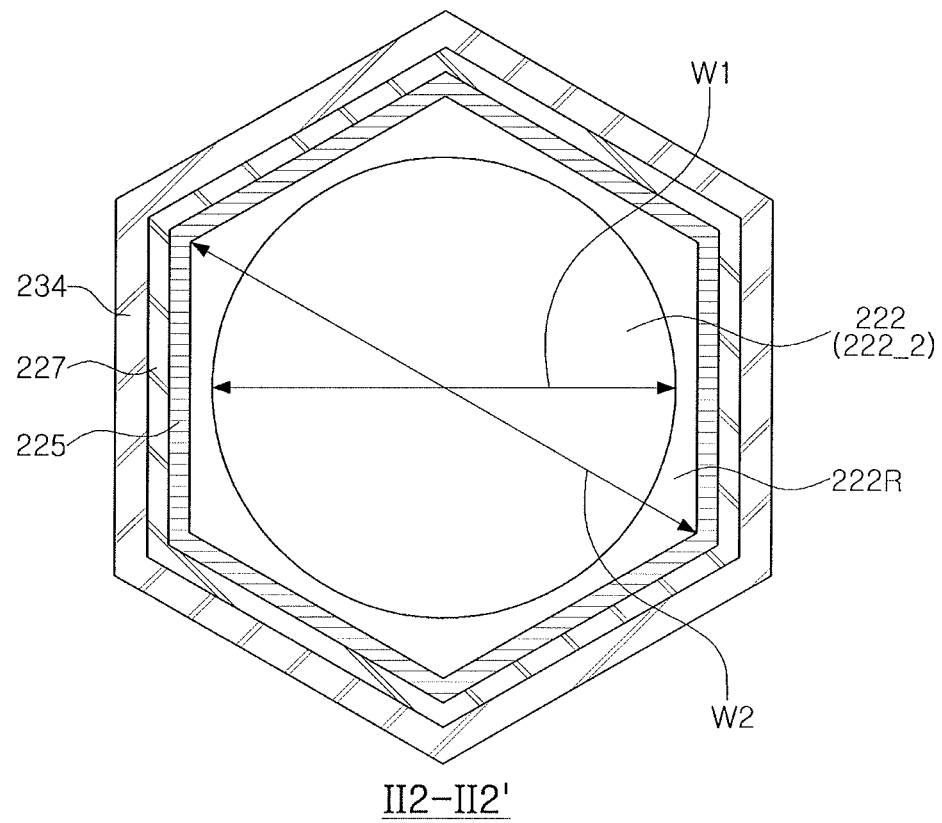

FIGS. 10B and 10C are cross-sectional views of the semiconductor light emitting device, taken along lines II1-II1' and II2-II2' illustrated in FIG. 1, respectively.

Referring to FIG. 10B, the first portion 222_1 of the first conductivity-type semiconductor rod 222 may have a cylindrical structure having a first width W1 and may have a circular cross section. Referring to FIG. 10C, the second portion 222_2 of the first conductivity-type semiconductor rod 222 may further include the regrowth layer 222R formed on a side surface 222C2 thereof, and may have a hexagonal columnar structure with a hexagonal cross section. The second portion 222_2 of the first conductivity-type semiconductor rod 222 may have a second width W2 greater than the first width W1 by the regrowth layer 222R.

The regrowth layer 222R may be obtained by regrowing the first conductivity-type semiconductor on a side surface 222C2 of the second portion 222_2 of the first conductivity-type semiconductor rod 222 by a MOCVD process. Surface damage of the side surface 222C2 of the second portion 222_2 of the first conductivity-type semiconductor rod 222 may be eliminated by the regrowth layer 222R, and a good quality active layer 225 may be deposited.

A current blocking layer 223 may be formed on the second surface 222B of the first conductivity-type semiconductor rod 222. The current blocking layer 223 in the present example embodiment includes a second conductivity-type semiconductor film 223a and a first conductivity-type semiconductor film 223b sequentially formed on the second surface 222B of the first conductivity-type semiconductor rod 222. For example, the second conductivity-type semiconductor film 223a and the first conductivity-type semiconductor film 223b may be a p-type GaN film and an n-type GaN film, respectively. Thus, even when a connection metal for bonding to a second electrode layer is formed on the current blocking layer 223 when mounted on an external device such as a display apparatus, a reverse bias may be applied by the current blocking layer 223 such that non-required current flow through the second surface 222B of the first conductivity-type semiconductor rod 222 may be prevented. In the present example embodiment, the current blocking layer 223 is formed on the second surface 222B of the first conductivity-type semiconductor rod 222 before the active layer 225 is formed. Thus, the active layer 225 may also extend to a side surface of the current blocking layer 223. The current blocking layer 223 may be variously modified. For example, the current blocking layer 223 may also be formed of an insulator (see FIG. 12).

The first electrode layer in the present example embodiment may include the ohmic contact layer 214 connected to the first surface 222A of the first conductivity-type semiconductor rod 222. The ohmic contact layer 214 may include, for example, at least one of silver (Ag), aluminum (Al), nickel (Ni), chromium (Cr), copper (Cu), gold (Au), palladium (Pd), platinum (Pt), tin (Sn), tungsten (W), rhodium (Rh), iridium (Ir), ruthenium (Ru), magnesium (Mg), zinc (Zn), and alloy materials thereof. In an example embodiment, the ohmic contact layer 214 may include W or WSi.

The second electrode layer 234 may be disposed on the second conductivity-type semiconductor layer 227. In the present example embodiment, the second electrode layer 234 may be located only in an area corresponding to the second side surface 222B of the first conductivity-type semiconductor rod 222. The second electrode layer 234 may include, for example, Ag, Ni, Al, Cr, Rh, Pd, Ir, Ru, Mg, Zn, Pt, or Au. In an example embodiment, the second electrode layer 234 may be a transparent electrode formed of a transparent conductive oxide or a transparent conductive nitride, or may include graphene. For example, the second electrode layer 234 may be at least one selected from ITO, ZITO, ZIO, GIO, ZTO, FTO, AZO, GZO, $In_4Sn_3O_{12}$, and $Zn_{(1-x)}Mg_xO$ ($0 \leq x \leq 1$).

The semiconductor light emitting device 200 according to the present example embodiment may include the ohmic contact layer 214 as the first electrode layer as well as the second electrode layer 234 while having the nanorod structure. Similar to the previous example embodiments, the ohmic contact layer 214 may be provided before the light emitting structure 220 is grown, and thus may have a form embedded in the first surface 222A of the first conductivity-type semiconductor rod 222. The ohmic contact layer 214 may be formed in the first region A1 of the first surface 222A, and the second region A2 may be a cut surface such as a cleavage plane obtained when the semiconductor light emitting device 200 is separated from the substrate. Although somewhat different depending on the crystal plane split upon separation from the substrate, the second region A2 may have a structure protruding to be higher than, or beyond, the surface in the first region A1 with respect to a vertical direction in FIG. 9. In addition, the second region A2 may have a structure surrounded by the first region A1, such that the second region A2 may be easily separated.

Figure 11:
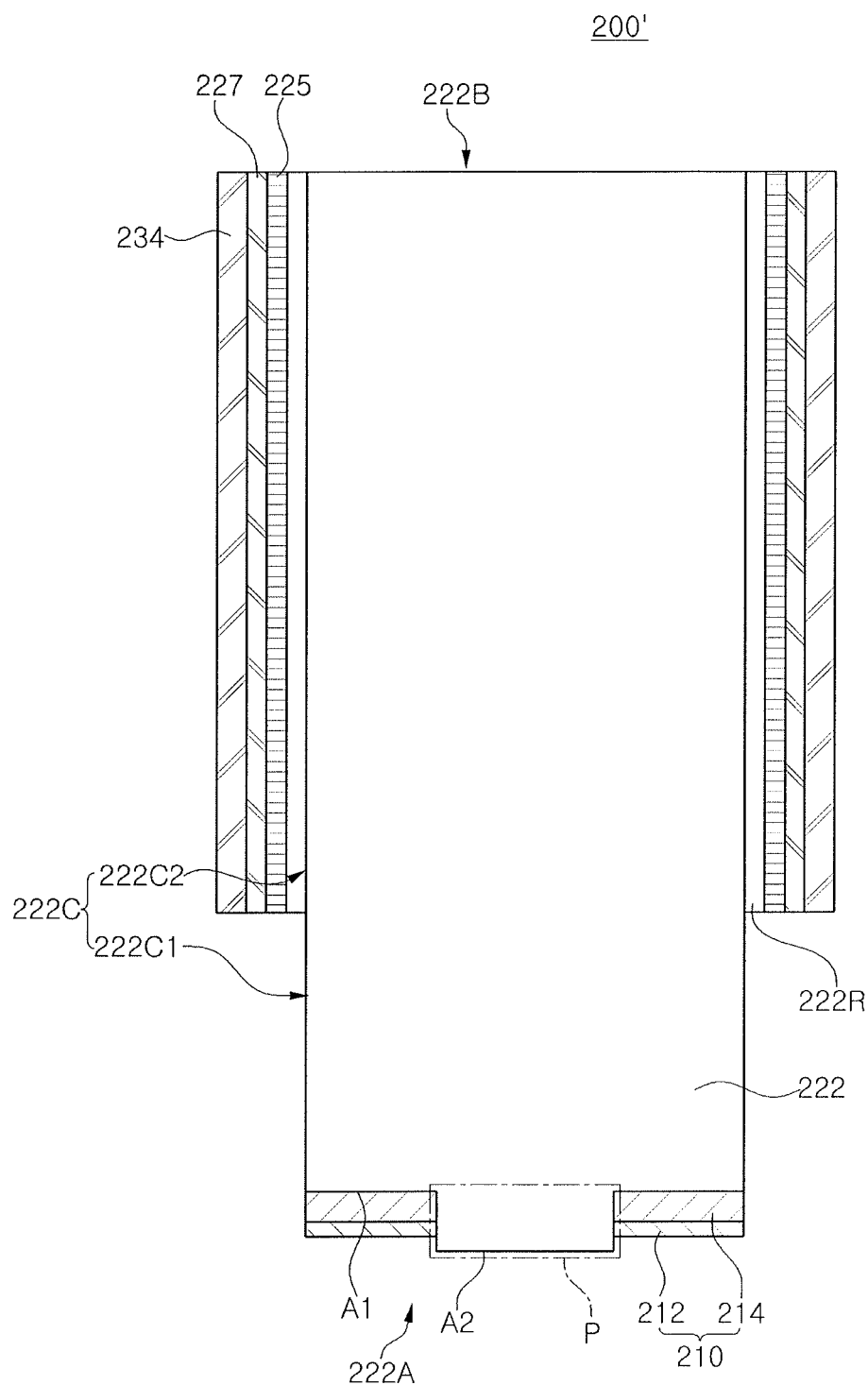
FIGS. 11 and 12 illustrate side cross-sectional views of semiconductor light emitting devices according to various embodiments.
Figure 12:
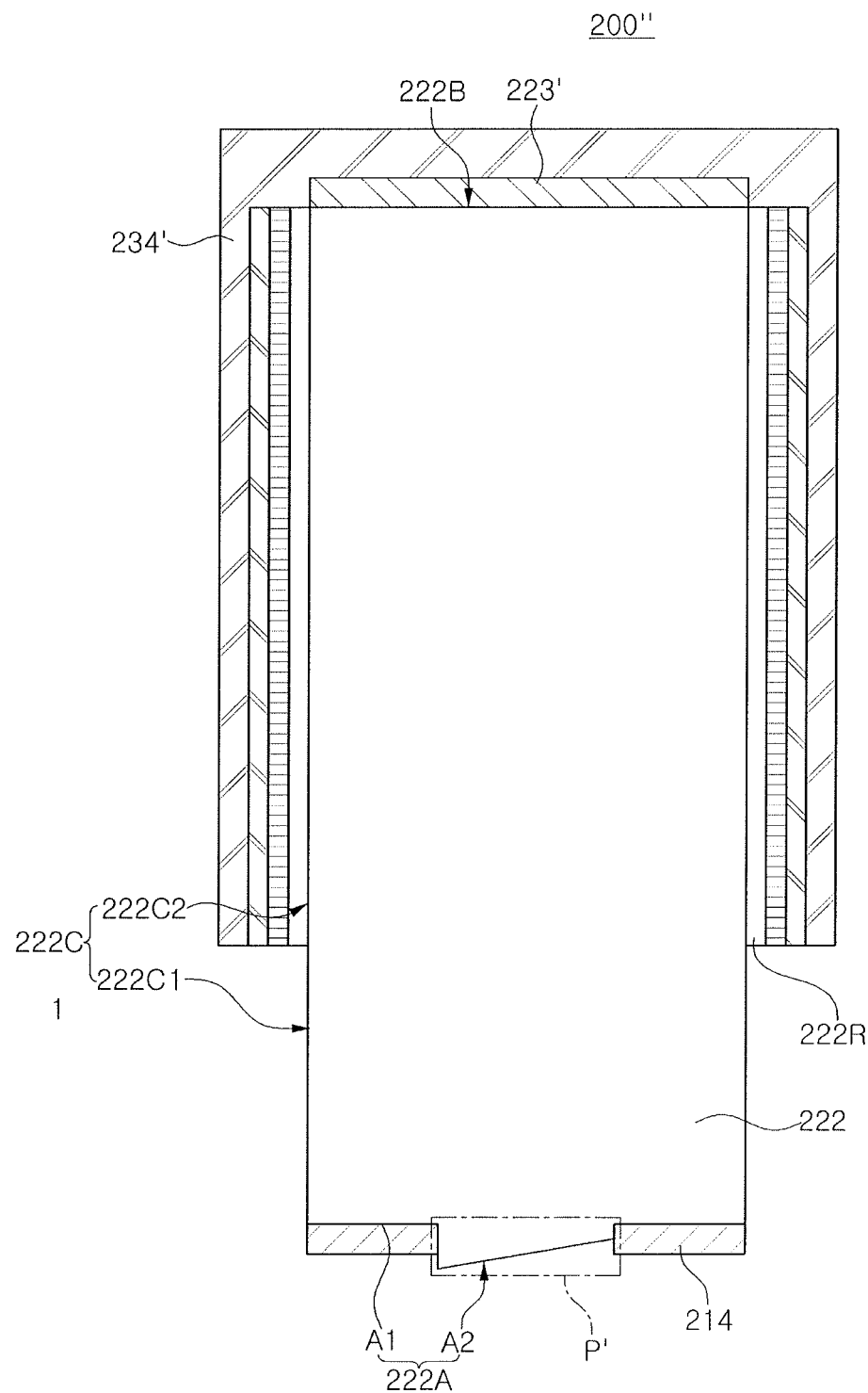

FIGS. 11 and 12 are side cross-sectional views illustrating semiconductor light emitting devices according to various example embodiments.

Referring to FIG. 11, a semiconductor light emitting device 200' according to an example embodiment may be similar to the semiconductor light emitting device 200 illustrated in FIGS. 9 to 10C, except that a current blocking structure is not introduced into the second surface 222B of the first conductivity-type semiconductor rod 222, and the first electrode layer is provided with a multilayer structure. The components of the present example embodiment may be understood with reference to the description of the same as or similar components to the semiconductor light emitting device 200 illustrated in FIGS. 9 to 10C unless otherwise described.

A second electrode layer and an active layer are not disposed on a second surface of a first conductivity-type semiconductor rod. Therefore, a current blocking structure may not be provided on the second surface of the first conductivity-type semiconductor rod. Similarly to the previous embodiment, a semiconductor light emitting device according to the present example embodiment has a structure of emitting light by only utilizing a side surface of a second portion of the first conductivity-type semiconductor rod.

A first electrode layer 210 may be embedded in the first surface 222A of the first conductivity-type semiconductor rod 222. The first electrode layer 210 in the present example embodiment may have a multilayer structure. The first electrode layer 210 may include an ohmic contact layer 214 connected to the first conductivity-type semiconductor rod 222 and a metal nitride layer 212 disposed on the ohmic contact layer 214.

The ohmic contact layer 214 may include, for example, at least one of Ag, Al, Ni, Cr, Cu, Au, Pd, Pt, Sn, W, Rh, Ir, Ru, Mg, Zn, and alloy materials thereof. In an example embodiment, the ohmic contact layer 214 may include W or WSi. For example, the metal nitride layer 212 may include TiN, TaN, or WN as a conductive layer.

Referring to FIG. 12, a semiconductor light emitting device 200" according to an example embodiment may be similar to the semiconductor light emitting device 200 illustrated in FIGS. 9 to 10C, with the exceptions that a protruding structure P' has a different shape, a current blocking layer 223' includes an insulator, and a second electrode layer 234 extends on an upper surface of a first conductivity-type semiconductor rod 222. Components of the present example embodiment may be understood with reference to the descriptions of the same or similar components of the semiconductor light emitting device 200 illustrated in FIGS. 9 to 10C unless otherwise described.

At the first surface 222A of the first conductivity-type semiconductor rod 222, the semiconductor light emitting device 200" according to the present example embodiment has a protruding structure P'. The first region A1 (in which an ohmic contact layer 214 as the first electrode layer is disposed) may have a surface that has a lower level than, or is vertically offset relative to, a surface in the second region A2.

As illustrated in FIG. 12, the protruding structure P' may be formed at least partially lower than the ohmic contact layer 214. The protruding structure P' may have a surface obtained by separating the light emitting structure 220 from a substrate by concentrating stress on a portion surrounded by the ohmic contact layer 214, and may thus be split in various shapes due to the presence of existing cracks (for example, crystal defects) or the like. For example, as in the present example embodiment, the second region A2 of the first surface 222A may have an oblique surface.

A current blocking layer 223' in the present example embodiment may be formed of an insulator. The semiconductor light emitting device 200 illustrated in FIG. 9 may be implemented with a P-N junction structure using reverse bias. In the present example embodiment, the same current blocking effect as that in the example embodiment with reference to FIG. 9 may be provided by forming an electrically insulating material as in the present example embodiment. A current blocking layer formed of an insulator may be provided as a growth suppression layer, such as an SiN layer (see growth suppression layer 257 in FIG. 13E) remains without removal.

The second electrode layer 234 in the present example embodiment may extend on the upper surface of the first conductivity-type semiconductor rod 222. Even in a case in which the second electrode layer 234 is positioned on the upper surface of the first conductivity-type semiconductor rod 222, current may not be conducted to the upper surface of the first conductivity-type semiconductor rod 222 by the current blocking layer 223'.

FIGS. 13A to 13E are cross-sectional views illustrating main processes of a method of manufacturing a semiconductor light emitting device according to an example embodiment (in detail, a method of forming a first conductivity-type semiconductor nanorod), and FIGS. 14A to 14F are cross-sectional views illustrating main processes of a method of manufacturing a semiconductor light emitting device according to an example embodiment.

Figure 13A:
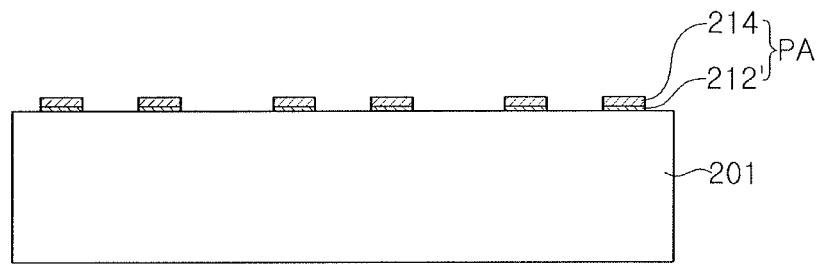
FIGS. 13A to 13E illustrate cross-sectional views of stages in a method of manufacturing a semiconductor light emitting device according to an example embodiment.

First, referring to FIG. 13A, patterns PA including a metal layer 212' and an ohmic contact layer 214 may be formed on a nitride single crystal substrate 201.

This result may be obtained through processes similar to those of FIGS. 5A and 5B. In detail, the metal layer 212' and the ohmic contact layer 214 may be sequentially deposited on the nitride single crystal substrate 101, using CVD or sputtering, and patterns for a first electrode layer may be formed. Each pattern PA may have a ring shape surrounded by one region.

The metal layer 212' employed in this process may include a metal capable of forming a metal nitride by reacting with a nitrogen component of the nitride single crystal substrate 201 under single crystal growth conditions for the light emitting structure. For example, the metal layer 212' may include Ta, Ti or W.

Figure 13B:
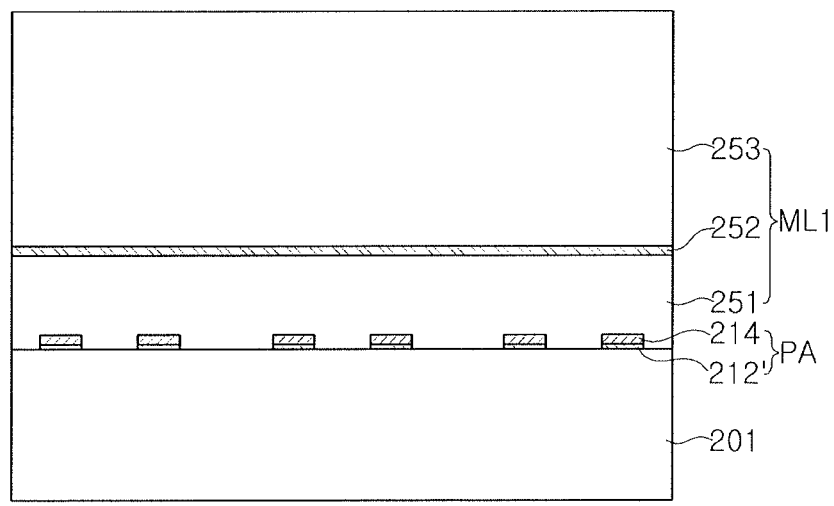

Referring to FIG. 13B, an amorphous insulating layer ML1 may be formed on the nitride single crystal substrate 201 to cover the patterns PA.

The amorphous insulating layer ML1 may be used as a mold structure for the formation of the first conductivity-type semiconductor rod. The amorphous insulating layer ML1 may include a first insulating film 251, a second insulating film 252, and a third insulating film 253 having different etching ratios. In an example embodiment, the first and third insulating films 251 and 253 may be formed of the same material. For example, the first and third insulating films 251 and 253 may include $SiO_2$, and the second insulating film 252 may include SiN.

Figure 13C:
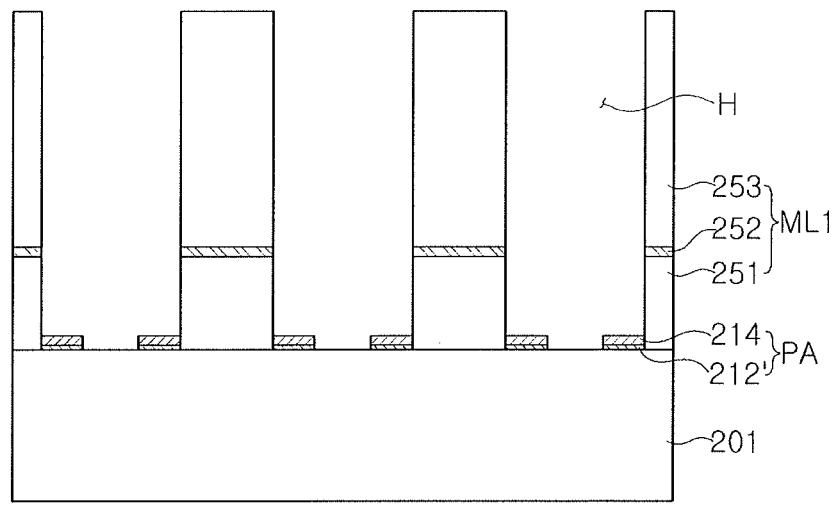
Figure 15:
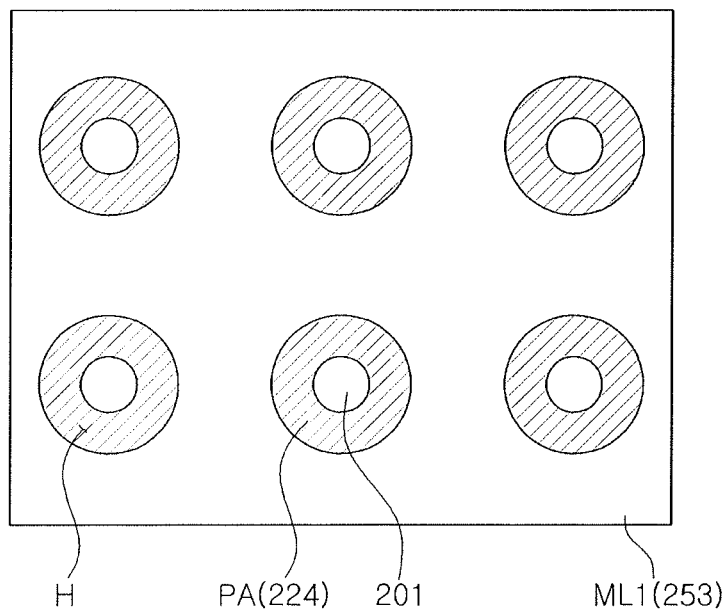
FIG. 15 illustrates a plan view of a process resultant (after forming nanoholes) illustrated in FIG. 13C.

Referring to FIG. 13C, nanoholes H may be formed in the amorphous insulating layer ML1. FIG. 15 is a plan view illustrating a process resultant (after forming nanoholes) illustrated in FIG. 13C.

In this process, all of the first to third insulating films 251, 252, and 253 may be etched to form the nanoholes H corresponding to the first conductivity-type semiconductor rod. Such etching may be implemented by, for example, dry etching using plasma. The nanoholes H may have a circular shape as illustrated in FIG. 15. Ring-shaped patterns PA of the metal layer 212' and the ohmic contact layer 214, previously formed, may be exposed by the nanoholes H. In the present example embodiment, the nanoholes H may be formed to correspond to the outer edges of the patterns PA having a ring-shaped bottom or to be slightly smaller than the outer lines of the patterns PA.

Figure 13D:
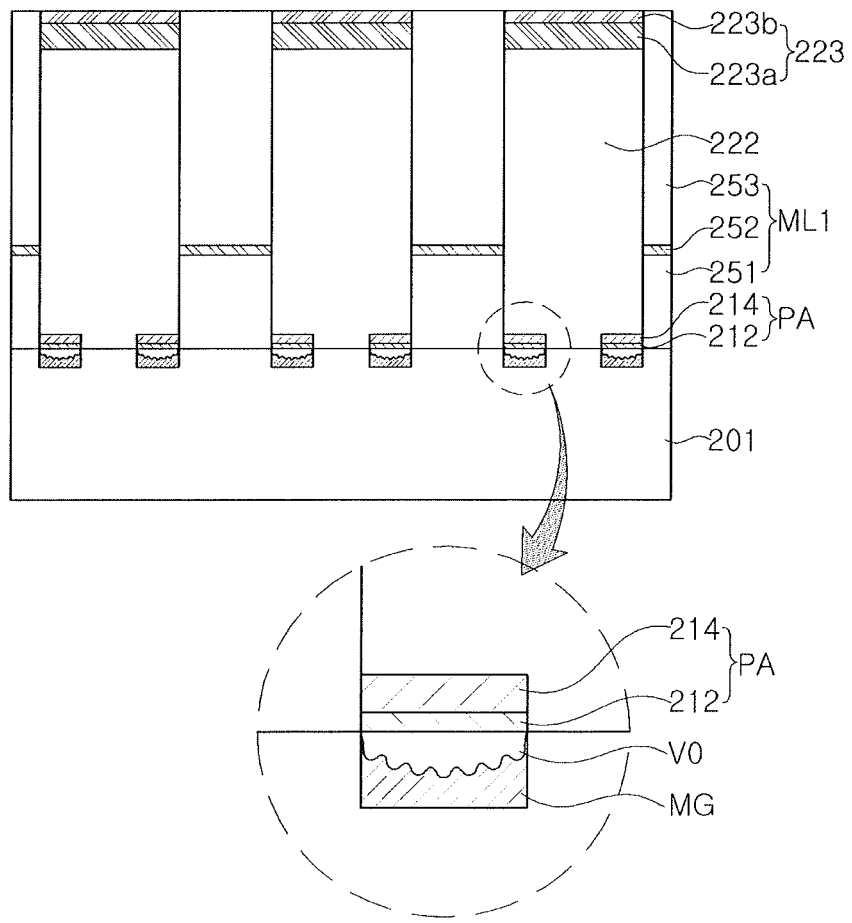

Referring to FIG. 13D, a first conductivity-type semiconductor rod 222 may be formed in the nanoholes H.

The first conductivity-type semiconductor rod 222 may be formed in the nanoholes H, using, for example, a metal organic chemical vapor deposition (MOCVD) process. The first conductivity-type semiconductor rod 222 may be formed of, for example, n-type GaN. This growth process may be performed at a relatively high temperature. Thus, nitrogen in the region of the nitride single crystal substrate 201 adjacent to the metal layer 212' may migrate to the metal layer 212' and react with the metal layer 212' during the growth process, thereby forming a metal nitride layer 212. The metal nitride layer 212 may include, for example, TiN, TaN, or WN.

As a result of this reaction, vacancies due to nitrogen migration may be generated in the adjacent region of the nitride single crystal substrate 201 adjacent to the metal layer 212', and a metal component MG, for example, gallium, remaining in a high temperature process is melted to form a void region V0. The void region V0 may be formed depending on a pattern region in contact with the metal layer (or the metal nitride layer 212), and may facilitate separation of the light emitting structure 220 in a subsequent process (see FIG. 14F).

In the present example embodiment, the second conductivity-type semiconductor film 223a and the first conductivity-type semiconductor film 223b may be sequentially formed as the current blocking layer 223 on the first conductivity-type semiconductor rod 222. For example, the second conductivity-type semiconductor film 223a and the first conductivity-type semiconductor film 223b may be a p-type GaN film and an n-type GaN films, respectively. The p-type GaN film may be doped with p-type impurities at a concentration of $1 \times 10^{17}/cm^3$ to $1 \times 10^{18}/cm^3$.

Figure 13E:
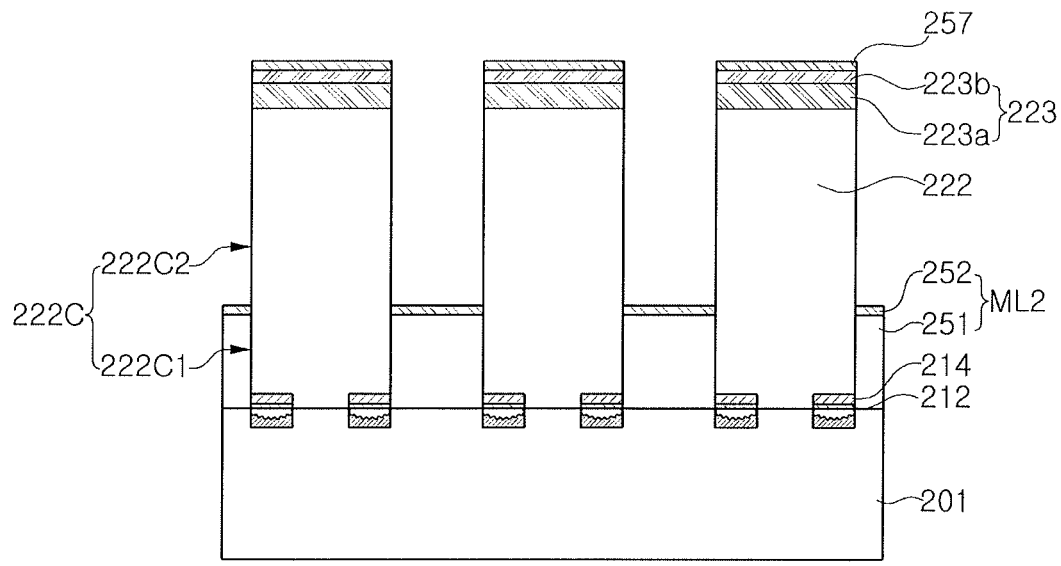

Referring to FIG. 13E, the amorphous insulating layer ML1 may be partially removed to expose a second portion side surface 222C2 of the first conductivity-type semiconductor rod 222.

In this process, the third insulating film 253 may be removed to expose the second portion side surface 222C2 of the first conductivity-type semiconductor rod 222, while a first portion side surface 222C1 of the first conductive-type semiconductor rod 222 may still be covered with a partially removed amorphous insulating layer ML2.

Before partially removing the amorphous insulating layer ML1, the growth suppression layer 257 may be formed on the upper surface of the first conductivity-type semiconductor rod 222, respectively. The growth suppression layer 257 may be employed as an element for suppressing further growth on the upper surface of the first conductivity-type semiconductor rod 222 in a subsequent semiconductor growth process. The growth suppression layer 257 may be formed of the same as or similar material to a material of the second insulating film 252 as an amorphous insulating material. For example, the growth suppression layer 257 may include SiN. Therefore, even in a case in which the process of partially removing the amorphous insulating layer ML1 is performed in an etching condition of the third insulating film 253, the growth suppression layer 257 may remain together with the second insulating film 252 used as an etch stop layer.

Figure 14A:
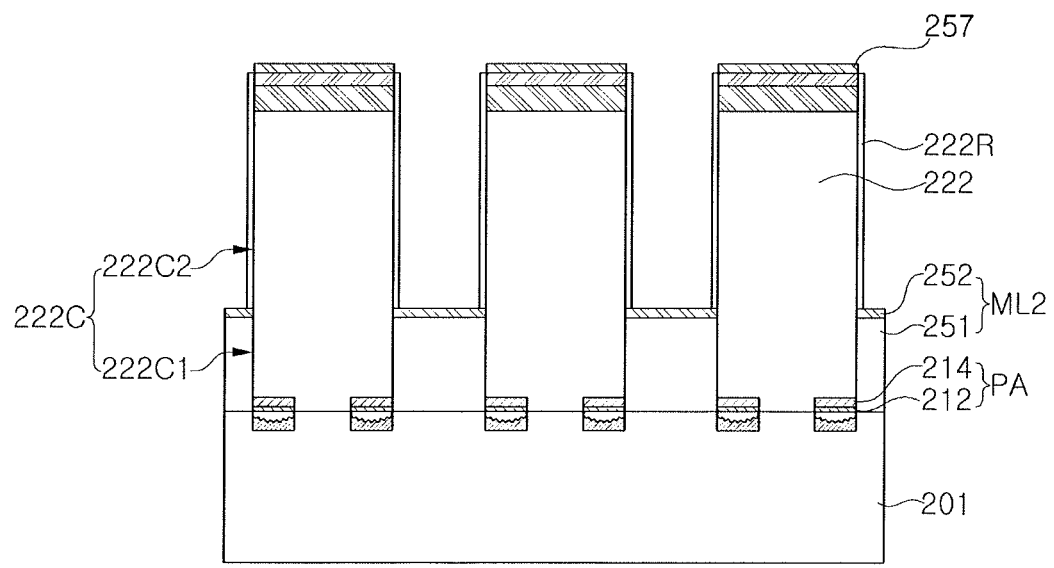
FIGS. 14A to 14F illustrate cross-sectional views of stages in a method of manufacturing a semiconductor light emitting device according to an example embodiment.
Figure 16:
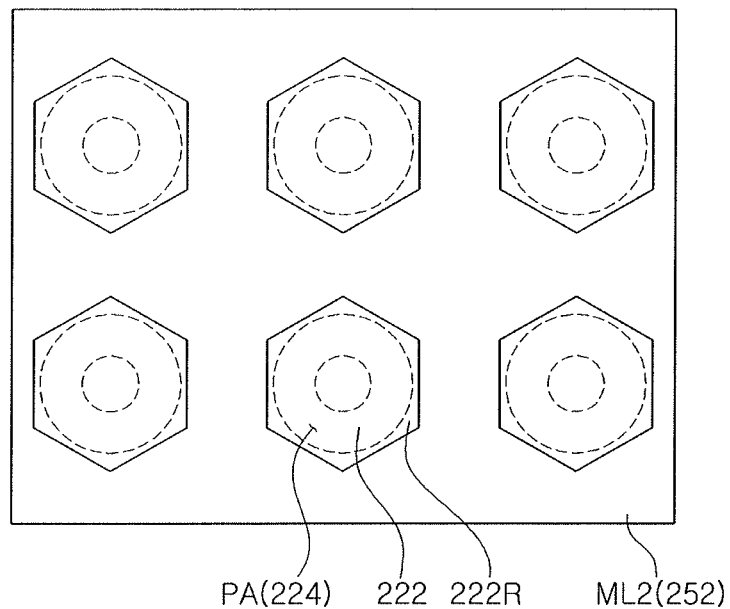

Next, referring to FIG. 14A, a regrowth layer 222R may be formed on the second portion side surface 222C2 of the first conductivity-type semiconductor rod 222. FIG. 16 is a plan view illustrating a process result (after regrowth) illustrated in FIG. 14A.

The regrowth layer 222R may be formed under similar conditions as the MOCVD process for the first conductivity-type semiconductor rod 222. Surface damage of the second portion side surface 222C2 of the first conductivity-type semiconductor rod 222 may be eliminated by the regrowth layer 222R. Accordingly, an active layer 225 and a second conductivity-type semiconductor layer 227 on the regrowth layer 222R may be grown to be relatively high quality single crystal layers.

The regrowth layer 222R may have a stable crystal plane. Thus, an upper region of the first conductivity-type semiconductor rod 222 on which the regrowth layer 222R is formed may have a hexagonal columnar structure as illustrated in FIG. 16. The upper region of the first conductivity-type semiconductor rod 222 may have a width greater than that of a lower region by the additional regrowth layer 222R. As described above, by this process, the lower region of the first conductivity-type semiconductor rod 222 may have a cylindrical structure, and the upper region of the first conductivity-type semiconductor rod 222 may have a hexagonal columnar structure.

Figure 14B:
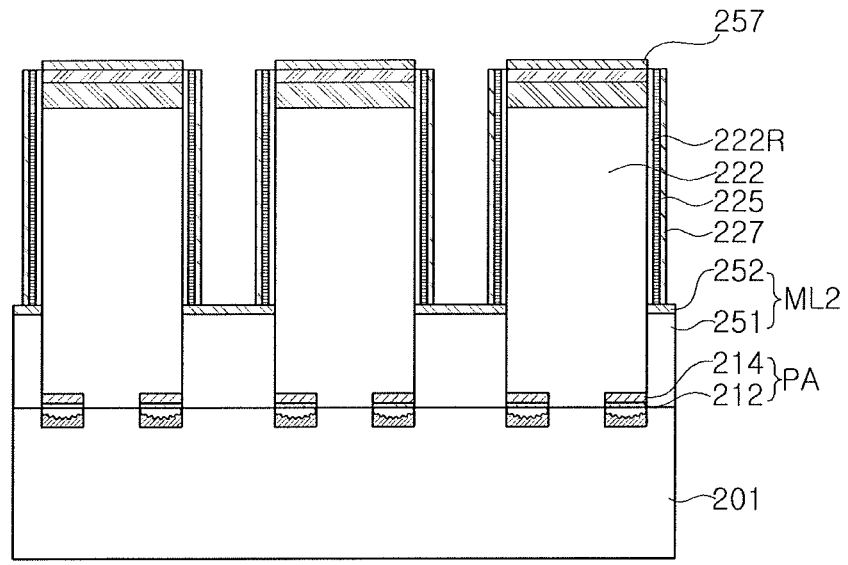
Figure 14C:
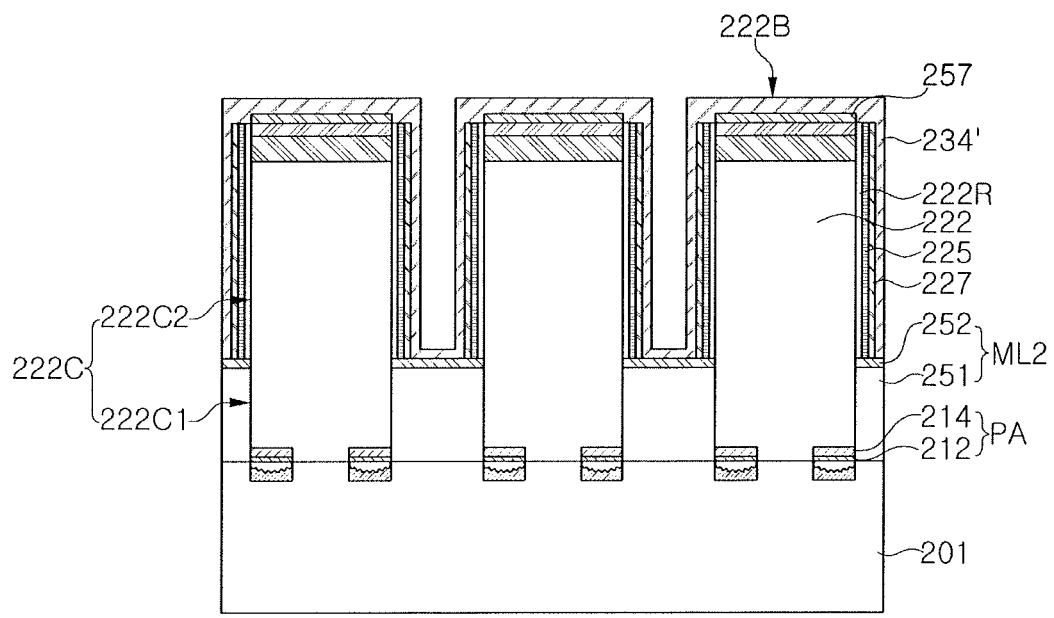

Referring to FIG. 14B, the active layer 225 and the second conductivity-type semiconductor layer 227 may be sequentially formed on the second portion side surface 222C of the first conductivity-type semiconductor rod 222. Subsequently, as illustrated in FIG. 14C, a second electrode layer 234' may be formed on the exposed portion of the first conductivity-type semiconductor rod 222.

Figure 14D:
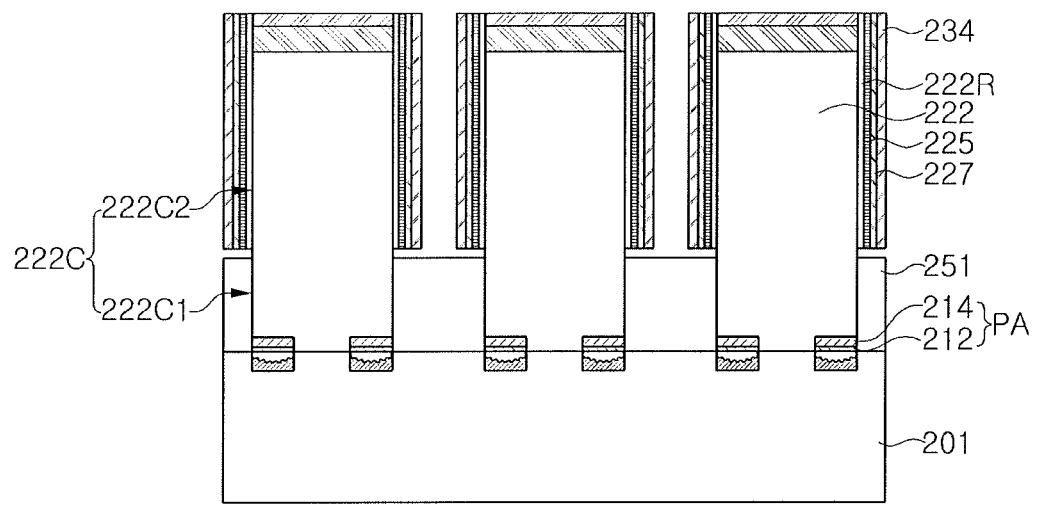

In the present example embodiment, as illustrated in FIG. 14D, a portion of the second electrode layer 234' disposed on the upper surface of the first conductivity-type semiconductor rod 222 may be removed using an etch back or anisotropic etching process, in such a manner that the second electrode layer 234 may remain only on the second conductivity-type semiconductor layer 227. In addition, a portion of the second electrode layer 234' disposed between the first conductivity-type semiconductor rods 222 may also be removed in this etching process to expose the second insulating film 252 of the amorphous insulating layer ML2, and thus, the growth suppression layer 257 may be removed from the upper surface of the first conductivity-type semiconductor rod 222, together with the second insulating film 252.

Figure 14E:
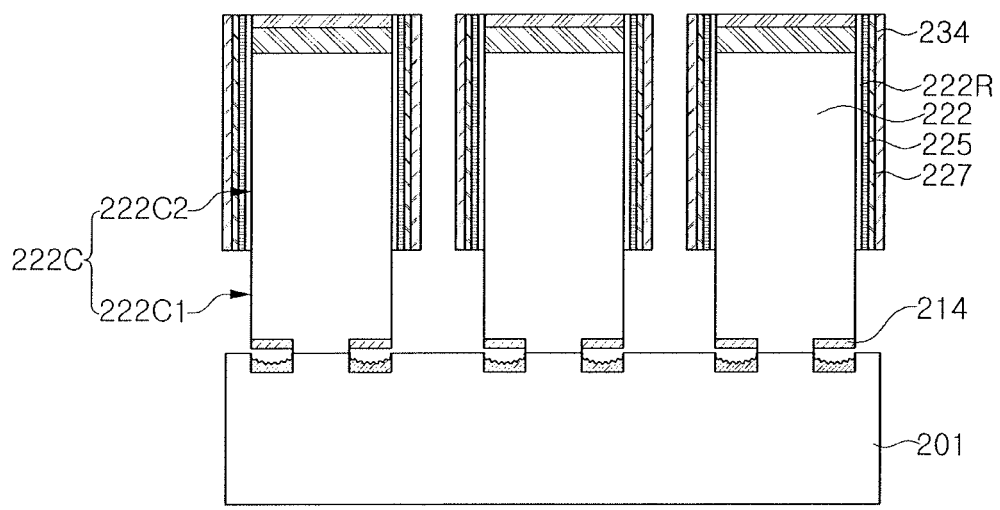

Subsequently, as illustrated in FIG. 14E, the first insulating film 251 may be removed to expose the first portion side surface 222C1 of the first conductivity-type semiconductor rod 222. In this process, the metal nitride layer 212 may be removed and the ohmic contact layer 214 may be exposed. In another example embodiment, the metal nitride layer 212 may be a conductive layer (such as a TiN, TaN, or WN layer) and may be provided as the first electrode layer 210 together with the ohmic contact layer 214.

Figure 14F:
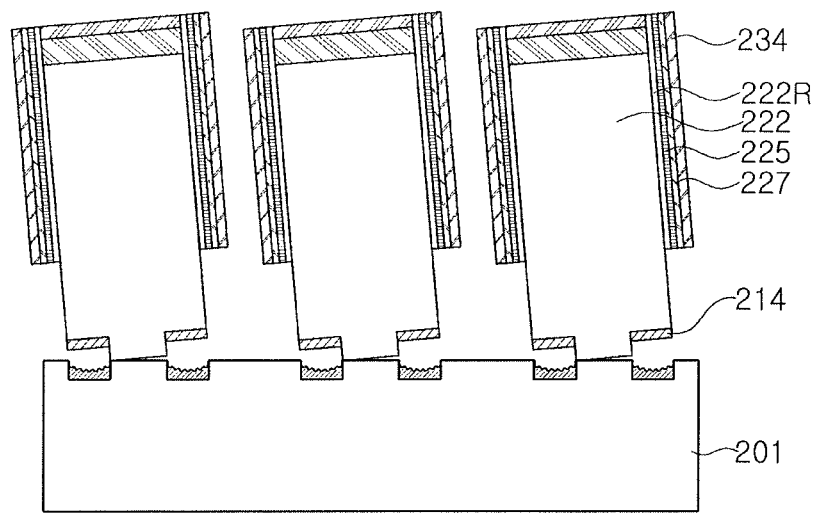

Referring to FIG. 14F, the semiconductor light emitting device 200 having the nanorod structure may be separated from the nitride single crystal substrate 201.

The light emitting structure 220 may be separated from the nitride single crystal substrate 201 by, for example, concentrating stress on a connection portion between the light emitting structure 220 and the nitride single crystal substrate 201 such that the connection portion is split. Such stress may be provided by relatively slight thermal or mechanical impacts. As described above, since the connection portion is surrounded by the already-separated patterns PA and may thus be easily separated.

Figure 17:
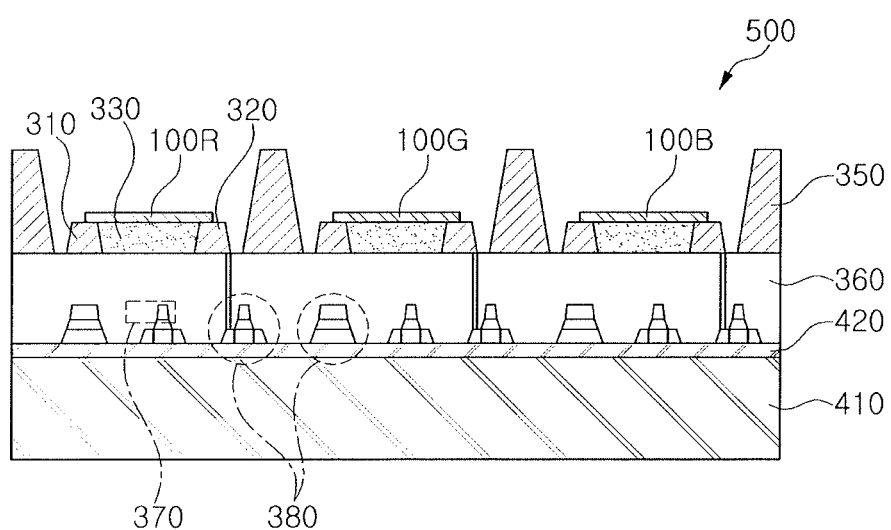
FIG. 17 illustrates a side cross-sectional view of a display apparatus according to an example embodiment.

The semiconductor light emitting devices 100, 100', 200, 200', and 200" having a nanorod structure as described above may be advantageously used as light sources constituting respective pixels of a display apparatus. FIG. 17 is a side sectional view illustrating a display apparatus employing a semiconductor light emitting device according to an example embodiment.

Referring to FIG. 17, a display apparatus 500 according to an example embodiment may include semiconductor light emitting devices 100R, 100G, and 100B having a nanorod structure, which may be disposed in respective pixel regions. The semiconductor light emitting devices 100R, 100G, and 100B having the nanorod structure may be configured to emit red, green, and blue light, respectively. Each pixel may be defined by a pixel defining layer 350.

The semiconductor light emitting devices 100R, 100G, and 100B having the nanorod structure may have a length to be disposed between first and second electrode portions 310 and 320, respectively. The semiconductor light emitting devices 100R, 100G, and 100B having the nanorod structure may be self-aligned between the first and second electrode portions 310 and 320, for example using an electric bias, and may be fixed by an insulating support 330.

Between a substrate 410 and the semiconductor light emitting devices 100R, 100G, and 100B, driving circuit devices 380 such as transistors Tr and capacitors C, and an insulating film 360 covering the driving circuit devices 380, may be further formed. A buffer layer 420 may be formed on the substrate 410.

In an example embodiment, a reflective film 370 may be further disposed below each of the semiconductor light emitting devices 100R, 100G, and 100B. The reflective film 370 may be formed separately from the circuit devices 380 or may be formed integrally with at least one circuit device 380. For example, the reflective film 370 may also be configured by extending the area of at least one of electrodes constituting one or more transistors Tr and/or capacitors C.

Figure 18:
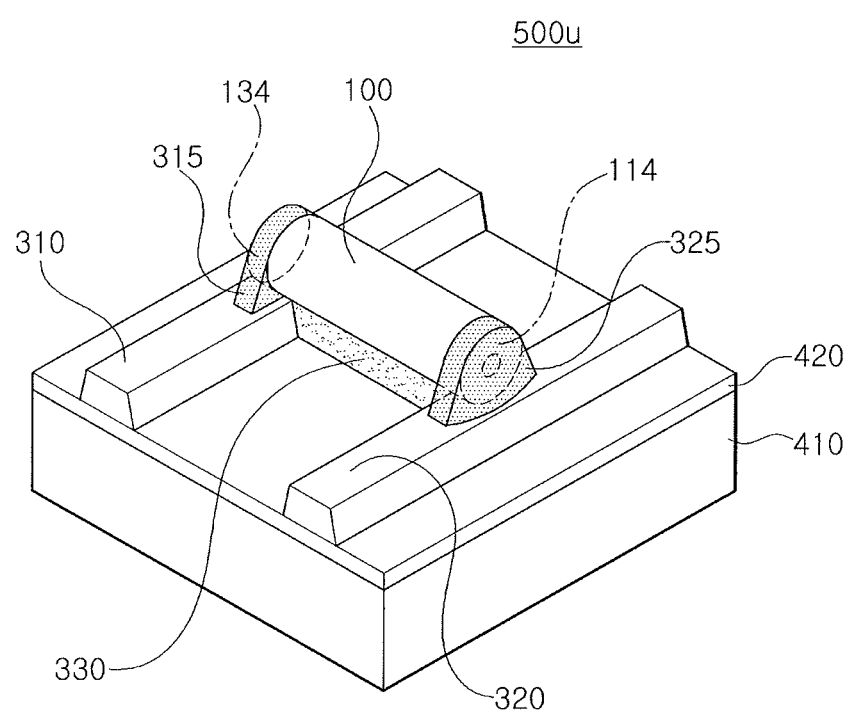
FIG. 18 illustrates a perspective view of one pixel of the display apparatus illustrated in FIG. 17.

FIG. 18 is a perspective view illustrating one pixel 500u of the display apparatus illustrated in FIG. 17. For convenience of description, the driving circuit devices 380 and the insulating film 360 disposed between the substrate 410 and the semiconductor light emitting devices 100R, 100G, and 100B are omitted.

Referring to FIG. 18, a semiconductor light emitting device 100 having a nanorod structure may be disposed between the first electrode portion 310 and the second electrode portion 320. The ohmic contact layer 114 (first electrode layer) and a second electrode layer 134 of the semiconductor light emitting device 100 having a nanorod structure may be connected to the first and second electrode portions by first and second connection electrodes 315 and 325, respectively. The first and second connection electrodes 315 and 325 may be formed of a transparent conductive material such as ITO, IZO, ITZO, or the like.

By way of summation and review, a general display apparatus may include a display panel, for example, a display panel that includes a liquid crystal display (LCD), and a backlight. A display apparatus may be implemented without a separate backlight by using an LED device for a single pixel. Such a display apparatus may be compact and may implement a high brightness with excellent light efficiency.

As set forth above, according to an example embodiment, a first conductivity-type semiconductor may have an ohmic contact layer, and a driving voltage of a semiconductor light emitting device having a nanorod structure may be lowered. When the semiconductor light emitting device is applied to respective pixels of a display apparatus, color uniformity may be prevented from being lowered due to non-uniform driving voltage.

As set forth above, embodiments may provide a nanorod-shaped semiconductor light emitting device having improved contact resistance. Embodiments may also provide a display apparatus having a nanorod-shaped semiconductor light emitting device with improved electrical characteristics.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor light emitting device, comprising:
a light emitting structure having a rod shape with first and second surfaces opposing each other and a side surface connected between the first and second surfaces, and including a first conductivity-type semiconductor providing the first surface, an active layer, and a second conductivity-type semiconductor;
a first electrode layer on a first region of the first surface of the light emitting structure and connected to the first conductivity-type semiconductor, the first region having a level that is vertically offset from a level of a second region adjacent thereto; and
a second electrode layer connected to the second conductivity-type semiconductor,
wherein the first electrode layer has a ring shape surrounding the second region, and contacts the first region,
wherein the light emitting structure has a hexagonal columnar structure, and the first electrode layer has a width greater than a width of the first surface of the light emitting structure.

2. The semiconductor light emitting device as claimed in claim 1, wherein the first surface of the light emitting structure is a non-flat surface from which the second region protrudes, and the second surface of the light emitting structure is a flat surface.

3. The semiconductor light emitting device as claimed in claim 1, wherein the second region of the first surface protrudes beyond the first electrode layer.

4. The semiconductor light emitting device as claimed in claim 1, wherein the second region of the first surface is a cleavage plane of the first conductivity-type semi conductor.

5. The semiconductor light emitting device as claimed in claim 1, wherein the first region surrounds the second region.

6. The semiconductor light emitting device as claimed in claim 1, wherein:

the first electrode layer includes an ohmic contact layer connected to the first surface of the first conductivity-type semiconductor, and the ohmic contact layer includes at least one of silver (Ag), copper (Cu), palladium (Pd), platinum (Pt), tin (Sn), tungsten (W), rhodium (Rh), iridium (Ir), ruthenium (Ru), magnesium (Mg), zinc (Zn), or alloy materials thereof.

7. The semiconductor light emitting device as claimed in claim 6, wherein the first electrode layer further includes a metal nitride layer disposed on the ohmic contact layer.

8. The semiconductor light emitting device as claimed in claim 6, wherein the ohmic contact layer includes W or WSi.

9. The semiconductor light emitting device as claimed in claim 1, wherein the second electrode layer includes a transparent electrode material.

10. The semiconductor light emitting device as claimed in claim 1, wherein the first and second conductivity-type semiconductors and the active layer are nitride semiconductors.

11. The semiconductor light emitting device as claimed in claim 1, wherein the first conductivity-type semiconductor and the second conductivity-type semiconductor provide the first and second surfaces, respectively, and the active layer is disposed between the first and second conductivity-type semiconductors.

12. The semiconductor light emitting device as claimed in claim 1, wherein the first conductivity-type semiconductor has the rod shape, and the active layer and the second conductivity-type semiconductor are sequentially stacked on a portion of a side surface of the first conductivity-type semiconductor, adjacent to the second surface.

13. The semiconductor light emitting device as claimed in claim 1, wherein each of the first conductivity-type semiconductor, the active layer, and the second conductivity-type semiconductor is hexagonal and has a same width in a horizontal direction.

14. A display apparatus, comprising:
a plurality of pixels; and
a first electrode portion and a second electrode portion disposed in a pixel among the plurality of pixels, the first electrode portion being spaced apart from the second electrode portion with the semiconductor light emitting device as claimed in claim 1 disposed therebetween such that the first electrode layer of the semiconductor light emitting device is connected to the first electrode portion and the second electrode layer of the semiconductor light emitting device is connected to the second electrode portion.

15. A semiconductor light emitting device, comprising:
a light emitting structure having a rod shape with first and second surfaces opposing each other and a side surface connected between the first and second surfaces, and including first and second conductivity-type semiconductor layers providing the first and second surfaces, respectively, and an active layer disposed between the first and second conductivity-type semiconductor layers;
a first electrode layer connected to the first conductivity-type semiconductor layer and disposed on a first region of the first surface of the light emitting structure, the first region having a level that is vertically offset relative to a level of a second region adjacent thereto; and
a second electrode layer on the second surface of the light emitting structure and connected to the second conductivity-type semiconductor layer,
wherein the light emitting structure has a hexagonal columnar structure,
wherein the first electrode layer has a circular ring shape, and has a width greater than a width of the first surface of the light emitting structure.

16. The semiconductor light emitting device as claimed in claim 15, wherein the first surface of the light emitting structure is a non-flat surface from which the second region protrudes, and the second surface of the light emitting structure is a flat surface.

17. The semiconductor light emitting device as claimed in claim 15, wherein the first electrode layer has a ring shape, and the second electrode layer is disposed on substantially all of the second surface of the light emitting structure.

18. The semiconductor light emitting device as claimed in claim 15, further comprising a passivation layer surrounding the side surface of the light emitting structure.

* * * * *